(12) United States Patent
Yang et al.

(10) Patent No.: US 7,323,371 B2
(45) Date of Patent: Jan. 29, 2008

(54) DEPOSITION METHOD OF INSULATING LAYERS HAVING LOW DIELECTRIC CONSTANT OF SEMICONDUCTOR DEVICE, A THIN FILM TRANSISTOR SUBSTRATE USING THE SAME AND A METHOD OF MANUFACTURING THE SAME

(75) Inventors: Sung-Hoon Yang, Seoul (KR); Wan-Shick Hong, Seoul (KR); Kwan-Wook Jung, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/071,544

(22) Filed: Mar. 3, 2005

(65) Prior Publication Data

US 2005/0148143 A1   Jul. 7, 2005

Related U.S. Application Data

(62) Division of application No. 10/150,482, filed on May 17, 2002, now Pat. No. 6,933,568.

(30) Foreign Application Priority Data

May 17, 2002   (KR) .......................... 2002-0027414

(51) Int. Cl.
*H01L 21/00* (2006.01)
*H01L 21/84* (2006.01)
(52) U.S. Cl. ................ 438/151; 257/347; 257/E27.111
(58) Field of Classification Search ................. 438/22, 438/29, 30, 142–166; 257/52, 57, 59, 347, 257/E27.111
See application file for complete search history.

(56) References Cited

U.S. PATENT DOCUMENTS

| 6,024,044 | A  | * | 2/2000 | Law et al. ............... 118/723 E |
| 6,590,226 | B2 | * | 7/2003 | Kong et al. .................. 257/59 |
| 6,872,976 | B2 | * | 3/2005 | Kong et al. .................. 257/59 |
| 6,984,594 | B2 | * | 1/2006 | Yang et al. ................. 438/789 |
| 2002/0117691 | A1 | * | 8/2002 | Choi et al. .................. 257/225 |

* cited by examiner

*Primary Examiner*—Brook Kebede
*Assistant Examiner*—Phillip S. Green
(74) *Attorney, Agent, or Firm*—F. Chau & Associates, LLC

(57) ABSTRACT

The present invention relates to a process for vapor depositing a low dielectric insulating film, a thin film transistor using the same, and a preparation method thereof, and more particularly to a process for vapor deposition of low dielectric insulating film that can significantly improve a vapor deposition speed while maintaining properties of the low dielectric insulating film, thereby solving parasitic capacitance problems to realize a high aperture ratio structure, and can reduce a process time by using silane gas when vapor depositing an insulating film by a CVD or PECVD method to form a protection film for a semiconductor device. The present invention also relates to a thin film transistor using the process and preparation method thereof.

14 Claims, 35 Drawing Sheets

K vs Silane Addition
DOE3 Only, All with ~4000 sccm Total Flow

N2O/(Z3MS+SiH4) Ratio vs Dep Rate

DEPOSITION METHOD OF INSULATING LAYERS HAVING LOW DIELECTRIC CONSTANT OF SEMICONDUCTOR DEVICE, A THIN FILM TRANSISTOR SUBSTRATE USING THE SAME AND A METHOD OF MANUFACTURING THE SAME

CROSS-REFERENCE TO RELATED APPLICATIONS

This application is a Divisional of U.S. application Ser. No. 10/150,482 filed on May 17, 2002, now U.S. Pat. No. 6,933,568 which claims priority to Korean Application No. 2002-27414 filed on May 17, 2002.

BACKGROUND OF THE INVENTION (a) Field of the Invention

The present invention relates to a method for vapor depositing a low dielectric insulating film, and more particularly to a method for vapor depositing a low dielectric insulating film that can significantly increase a vapor deposition speed of a low dielectric insulating film by adding silane gas ($SiH_4$) in a CVD or PECVD process used for forming a protection film of a semiconductor device.

(b) Description of the Related Art

A thin film transistor substrate is used as a circuit substrate for independently operating each pixel in a liquid crystal display, an organic EL (electro luminescence) display, etc. A thin film transistor substrate comprises scanning signal wiring for transmitting scanning signals and picture image signal lines for transmitting picture image signals or data wiring, a thin film transistor connected with gate wiring and the data wiring, pixel electrodes connected with the thin film transistor, a gate insulating film covering the gate wiring to insulate the same, and a protection film covering the data wiring to insulate the same. The thin film transistor comprises a semiconductor layer which forms a channel with a gate electrode that is a part of the gate wiring, source electrodes and drain electrodes that are part of the data wiring, a gate insulating film, and a protection film. A thin film transistor is a switching device which transmits or blocks picture image signals that are transmitted through the data wiring according to scanning signals transmitted through the gate wiring to the pixel electrodes.

The thin film transistor substrate is most commonly used in a liquid crystal display device. As the liquid crystal display device gradually becomes large and fixed, signal-twisting due to an increase in various parasitic capacitances is becoming more problematic. Further, in accordance with the need to improve brightness to increase the visibility range in a liquid crystal display device for a TV and to decrease power consumption in personal computers, an increase in an aperture ratio is needed. In order to increase the aperture ratio, pixel electrodes must be formed overlapping data wiring, but in such a case, the parasitic capacitance between the pixel electrodes and the data wiring increases.

In order to solve the problems caused by an increase in parasitic capacitance, the perpendicular spacing between the pixel electrodes and data lines should be sufficiently secured. In order to secure the perpendicular spacing, the protection film is formed of an organic insulating film. However, a process using an organic insulating film has the following disadvantages. First, the material is expensive. That is, there is a substantial amount of loss during spin coating, which increases material costs. Next, the organic film has minimal heat resistance and thus many limitations are given to subsequent processes. In addition, due to the agglomeration of material, impurity particles are frequently produced, the adhesive strength between an upper film and lower film is low, and etching errors are very large when forming pixel electrodes on a protection film.

Generally, $SiO_2$ and $SiN$ dielectric thin films are used for preparing various shapes of electric devices. There have been ongoing studies of optimized processes for preparing optical wave guides for flat panel displays from silicone IC's.

The material provides the requirements of all devices and strong electrical and mechanical properties. Recently, in order to improve the performance of devices, a conductive layer is more closely contacted or adhered closely together. In addition, in presently used devices, a lower power consumption necessary to allow operation using a battery is considered to be important rather than regular AC coupling. Therefore, in order to decrease electrical capacity coupling causing higher power consumption and slower operation speed, new material having a low dielectric constant is needed.

In order to solve these problems, material based on a Si-C bond of low density exclusive of additional functional groups is used. The material exhibits a low density and thus has a low dielectric constant. Such material is a—SiCOH or silicon oxycarbide, and exhibits a low dielectric constant of 2.7 to 3.5 and thus can greatly improve the performance of a semiconductor device.

Accordingly, if a low dielectric insulating film that is vapor-deposited by a CVD method such as a—SiCOH, a—Si:O:F, etc. is used as an interlayer insulating film and a protection film for a TFT-LCD panel, a coupling capacitance between data wiring and pixel electrodes decreases to lower an RC time delay and cross-talk. Particularly, for a super-high aperture ratio, the pixel electrodes should overlap the data electrodes. However, a $SiN_x$ protection film, which is one of the existing protection films, has a very large load capacitance and thus picture images are difficult to realize. Therefore, a dielectric constant of an insulating protection film should be made low as soon as possible, and a sufficient spacing in the perpendicular direction by increasing a thickness of a protection film is necessary. To realize this, a protection film that is vapor-deposited by the CVD method is mainly used.

In order to decrease the coupling capacitance in a—SiCOH film, there is needed a low dielectric interlayer insulating film vapor-deposited by the CVD method, according to its uses, and having a thickness of several micrometers. Since insulating thin films commonly used in semiconductor process are several millimeters in thickness, to compensate a drop in throughput resulting from the significant thickness, a very rapid vapor deposition speed is needed.

a—SiCOH thin film is typically vapor deposited by a PECVD (plasma enhanced chemical vapor deposition) method by adding an oxidant such as $N_2O$ or $O_2$ and inert gases such as Ar or He for improving uniformity and stabilizing properties to main source gas $SiH(CH_3)_3$ (hereinafter referred to as Z3MS™). For the a—SiCOH thin film, if the flow rate of source gas (for example, trimethylsilane), vapor deposition speed is known to also increase.

However, in the above method, the mechanical strength decreases as the flow rate of the main source gas increases to result in the formation of a thin film that is soft so as to be damaged in subsequent processes. Also, production costs increase because of the increased consumption of the comparatively expensive source gas. Further, if changes are made to various parameters in the CVD vapor deposition process so as to have the lowest dielectric constant (k), the dielectric constant rapidly increases, thereby making it necessary to further increase thickness. As shown in FIG. 1, as flow rate [Z3MS+N$_2$O] of total source gases increases, the dielectric constant linearly increases.

SUMMARY OF THE INVENTION

In order to solve the problems of the prior art, it is an object of the present invention to provide a process for vapor depositing a low dielectric insulating film for a semiconductor device that can reduce a process time and significantly improve a vapor deposition speed while maintaining a low dielectric constant and other physical properties to solve the problem of parasitic capacitance, thereby realizing a high aperture ratio structure.

It is another object of the present invention to provide a semiconductor device prepared using an insulating film vapor deposited by the above process as a protection film, and a process for preparing the same.

In order to achieve these objects, the present invention provides a process for vapor depositing a low dielectric insulating film for a semiconductor device comprising the step of adding a reactant gas mixture comprising a gas phase main source, SiH$_4$, and an oxidant to a vapor deposition chamber comprising a substrate to vapor deposit a—SiCOH thin film by a CVD or PECVD method.

The present invention also provides a semiconductor device comprising at least one of a first insulating film, a second insulating film, a buffer layer, a gate insulating film, and a protection film pattern on an insulating substrate, wherein at least one of the first insulating film, second insulating film, buffer layer, gate insulating film and protection film pattern is a low dielectric insulating film vapor deposited by a CVD or PECVD method by adding silane (SiH$_4$) gas.

The present invention also provides a semiconductor device comprising an insulating substrate, a first insulating film, a thin film transistor, a second insulating film, and pixel electrodes, wherein at least one of the first insulating film and the second insulating film is a low dielectric insulating film vapor deposited by adding silane (SiH$_4$) gas by a CVD or PECVD method.

The present invention also provides a semiconductor device comprising an insulating substrate, data wiring, color filters, a buffer layer, gate wiring, a gate insulating film, a semiconductor layer, and pixel wiring, wherein at least one of the buffer layer and gate insulating film is a low dielectric insulating film vapor deposited by adding silane (SiH$_4$) gas by a CVD or PECVD method.

The present invention also provides a semiconductor device comprising an insulating substrate, gate lines, gate wiring, a gate insulating film, a semiconductor layer pattern, a contact layer pattern, data wiring, a protection film pattern, and a transparent electrode layer pattern, wherein one of the gate insulating film and protection film pattern is a low dielectric insulating film vapor deposited by adding silane (SiH$_4$) gas by a CVD or PECVD method.

The present invention also provides a thin film transistor substrate comprising an insulating substrate; a first signal line formed on the insulating substrate; a first insulating film formed on the first signal line; a second signal line formed on the first insulating film intersecting the first signal line; a thin film transistor connected with the first signal line and the second signal line; a second insulating film that is a low dielectric insulating film, formed on the thin film transistor, and which has a first contact opening exposing predetermined electrodes of the thin film transistor; and a first pixel electrode that is formed on the second insulating film and connected with predetermined electrodes of the thin film transistor through the first contact opening.

The first insulating film may comprise a lower film that is a low dielectric insulating film and an upper film that is a silicon nitride film, and the second film may have an uneven pattern on its surface. Also, the pixel electrode may be formed of an opaque conductive material that reflects light or a transparent conductive material. The present invention also provides a thin film transistor substrate comprising data wiring comprising data lines formed on an insulating substrate; red, green, and blue color filters formed on the insulating substrate; a buffer layer that is a low dielectric insulating film, formed on the data wiring and the color filters and has first contact openings exposing predetermined portions of the data wiring; gate wiring formed on the buffer layer, comprising gate lines intersecting the data lines to define pixels and gate electrodes connected with the gate lines; a gate insulating film formed on the gate wiring and having second contact openings exposing at least a part of the first contact openings; a semiconductor layer formed on the gate insulating film, which is formed on the gate electrodes; source electrodes connected with the data lines through the first contact openings and the second contact openings, at least a part of which are contacted with the semiconductor layer; drain electrodes provided opposite to the source electrodes on the semiconductor layer; and pixel electrodes connected with the drain electrodes.

The present invention also provides a thin film transistor substrate for a liquid crystal display comprising an insulating film; gate wiring formed on the substrate and comprising gate lines, gate electrodes, and gate pads; a gate insulating film formed on the gate wiring and having contact openings exposing at least the gate pads; a semiconductor layer pattern formed on the gate insulating film; a contact layer pattern formed on the semiconductor layer pattern; data wiring formed on the contact layer pattern having substantially the same shape as the contact layer pattern and comprising source electrodes, drain electrodes, data lines, and data pads; a protection film pattern formed on the data wiring having contact openings exposing the gate pads, the data pads, and the drain electrodes, and made of a low dielectric insulating film; a transparent electrode layer pattern electrically connected with the exposed gate pads, data pads, and drain electrodes.

The present invention also provides a process for manufacturing a thin film transistor substrate comprising the steps of forming gate wiring comprising gate lines, gate electrodes connected with the gate lines, and gate pads connected with the gate lines on an insulating substrate; forming a gate insulating film; forming a semiconductor layer; stacking conductive material and patterning the material to form data wiring comprising data lines intersecting the gate lines, data pads connected with the data lines, source electrodes connected with the data lines and adjacent to the gate electrodes, and drain electrodes opposite the source electrodes with respect to the gate electrodes; vapor depositing a low dielectric insulating film to form a protection film; patterning the protection film together with the gate insulating film to form contact openings exposing each of the gate pad, data pad, and drain electrode; stacking a transparent conductive film and patterning the film to form supplement gate pads, supplement data pads, and pixel electrodes respectively connected with the gate pads, the data pads, and the drain electrodes through the contact openings.

The present invention also provides a process for manufacturing a thin film transistor substrate comprising a first step of forming data wiring comprising data lines on an insulating substrate; a second step of forming red, green, and blue color filters on an upper surface of the substrate; a third step of forming a buffer layer covering the data wiring and the color filters with a low dielectric insulating film; a fourth step of forming gate wiring comprising gate lines and gate electrodes on the upper surface of the insulating film; a fifth step of forming a gate insulating film covering the gate wiring; a sixth step of forming an ohmic contact layer and a semiconductor layer pattern on the gate insulating film simultaneously with forming first contact openings exposing a part of the data lines on the gate insulating film and the buffer layer; a seventh step of forming source electrodes and drain electrodes on the ohmic contact layer pattern in a state separated from each other but made on the same layer, and pixel wiring comprising pixel electrodes connected with the drain electrodes; an eighth step of removing the exposed part of the ohmic contact layer pattern located between the source electrodes and the drain electrodes to separate the ohmic contact layer pattern.

The low dielectric insulating film on the thin film transistor substrate is an a—SiCOH thin film manufactured by the above vapor deposition method.

BRIEF DESCRIPTION OF THE DRAWINGS

FIG. 16b and FIG. 16c are respectively cross sectional views taken along line Xb-Xb' and line Xc-Xc' line of FIG. 16a;

FIG. 18b and FIG. 18c are respectively cross sectional views taken along line XIIb-XIIb' and line XIIc-XIIc' line of FIG. 18a;

FIG. 23b and 23c are respectively cross sectional views taken along line XVIIb-XVIIb' and line XVIIc-XVIIc' of FIG. 23a;

FIG. 26b is a cross sectional view taken along line XXb-XXb of FIG. 26a;

FIG. 27a is an arrangement view of the substrate in a step following that of FIG. 26a;

FIG. 27b is a cross sectional view taken along line XXIb-XXIb' of FIG. 26a;

FIG. 28a is an arrangement view of the substrate in a step following that of FIG. 27a;

FIG. 28b is a cross sectional view taken along line XXIIb-XXIIb' of FIG. 28a;

FIG. 30b is a cross sectional view taken along line XXIVb-XXIVb' of FIG. 30a;

FIG. 33a is an arrangement view of the substrate in a step following that of FIG. 30a;

FIG. 33b is a cross sectional view taken along line XXVIIb-XXVIIb' of FIG. 33a;

FIG. 36b is a cross sectional view taken along line XXXb-XXXb' of FIG. 36a;

FIG. 37b is a cross sectional view taken along line XXXIb-XXXIb' of FIG. 37a;

FIG. 38b is a cross sectional view taken along line XXIIb-XXXIIb' of FIG. 38a;

FIG. 39b is a cross sectional view taken along line XXXIIIb-XXXIIIb' of FIG. 39a;

FIG. 40b is a cross sectional view taken along line XXXIVb-XXXIVb' of FIG. 40a;

DETAILED DESCRIPTION AND THE PREFERRED EMBODIMENTS

Figure 1:
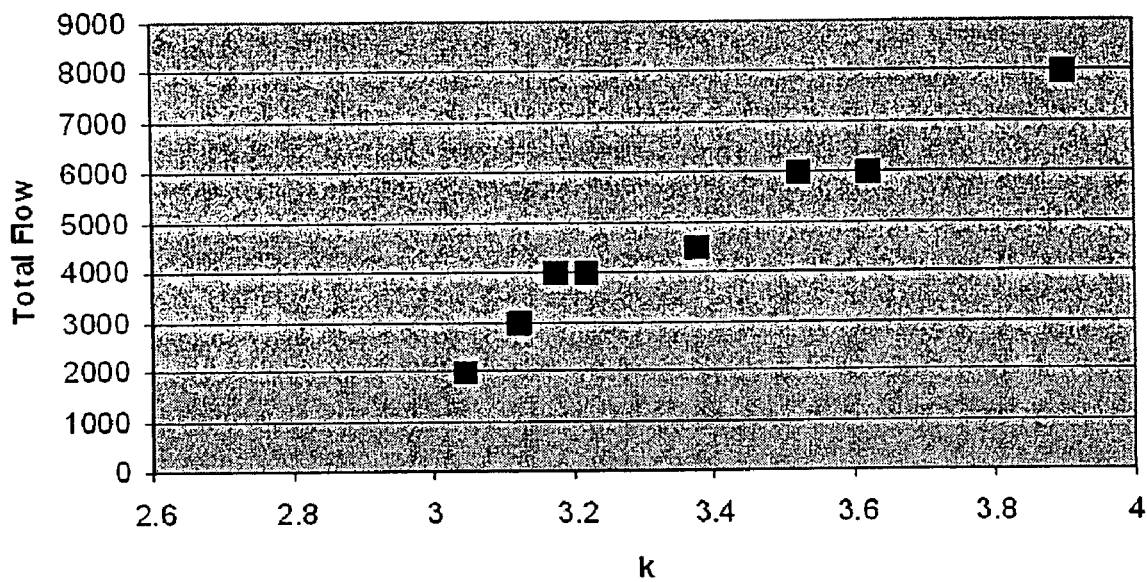
FIG. 1 shows changes in a dielectric constant (k) according to a flow rate of total source gas during a CVD process.

The present invention will now be explained in detail.

The present invention is characterized in that a vapor deposition speed is improved while maintaining other physical properties of a low dielectric insulating film (an a—SiCOH thin film) by adding silane (SiH$_4$) gas to source gas when forming a protection film for a semiconductor device such as a TFT-LCD.

Thus, the present invention can solve parasitic capacitance problems to realize a high aperture ratio structure, and can reduce a process time.

The a—SiOCH thin film (low dielectric insulating film) can be obtained by adding a reactant gas mixture comprising a gas phase main source, silane (SiH$_4$), and an oxidant to a vapor deposition chamber comprising a substrate by a CVD or PECVD method. In order to improve uniformity and stabilize properties, inert gas such as Ar or He can be included.

Preferably, vapor deposition is performed by a PECVD (plasma enhanced chemical vapor deposition) method conducted by exposing a reactant gas mixture to plasma at a power density of 0.2 to 1.5 mW/cm$^2$, a temperature of 25 to 300° C., and under a pressure of 1 to 10,000 Torr.

In order to manufacture the a—SiCOH thin film (low dielectric film) having a dielectric constant of 3.6 or less and a light transmittance of 95% or more at a wavelength range of 400 to 800 nm, it is important to control the amounts of silane and oxidant during reaction.

Therefore, the ratio of silane (SiH$_4$) gas to main source gas is preferably 1:0.5 to 1. If this range is exceeded, the dielectric constant increases and thus the vapor deposition speed cannot be improved.

The dielectric constant of the low dielectric insulating film is preferably 2 to 3. Also, a thickness of the protection film is preferably 1.5 μm or more, and more preferably 1.5 to 4.0 μg. The substrate is preferably selected from the group consisting of a liquid crystal display device, a light emitting diode display device, and an organic light emitting diode display device, and more preferably the substrate is a liquid crystal display device.

The main source gas is preferably selected as one or more in the group consisting of organosilicon compounds represented by the following Chemical Formulae 1, 2 and 3.

$$SiH_x(CH_3)_{4-x} \quad \text{[Chemical Formula 1]}$$

wherein, x is an integer, that is, 0, 1, 2 or 4, $$Si(OR^1)_x R^2_{4-x} \quad \text{[Chemical Formula 2]}$$

wherein, R$^1$ and R$^2$ are independently or simultaneously straight or branched C1-10 alkyl or alkenyl group substituted or unsubstituted by C1-5 alkyl or alkenyl group, and preferably R$^1$ and R$^2$ are independently or simultaneously methyl, ethyl, propyl or vinyl group, and x is an integer from 0 to 4.

$$\text{cyclic-}(SiR^1R^2\text{—}O)_n \quad \text{[Chemical Formula 3]}$$

wherein, R$^1$ and R$^2$ are independently or simultaneously hydrogen, straight or branched C1-10 alkyl or alkenyl group substituted or unsubstituted by C1-5 alkyl or alkenyl group, and preferably R$^1$ and R$^2$ are independently or simultaneously hydrogen, methyl, ethyl, propyl or vinyl group.

The oxidant is preferably selected from the group consisting of O$_2$, N$_2$O, NO, CO$_2$, CO, ozone, and a mixture thereof.

The a—SiCOH thin film vapor deposited by the process of the present invention can be used for an insulating film during the manufacturing process of a semiconductor device, preferably a liquid crystal display device, to cover a semiconductor layer of a liquid crystal display device thereby effectively protecting the semiconductor layer.

As explained above, if a low dielectric insulating film is vapor deposited while optimizing compositional ratios of each gas by the process according to the present invention, the vapor deposition speed can be greatly improved, and thus a drop in throughput occurring as a result of increases in thickness by 10 times or more compared to the existing SiNx thin film can be compensated without damaging mechanical strength and subsequent processes. Also, manufacturing costs resulting from increasing consumption of the comparatively expensive conventional source gas can be reduced.

The present invention will now be explained in more detail with reference to the following Examples. However, the Examples merely illustrate the present invention and the present invention is not limited to them.

EXAMPLES 1 to 9

Using a capacitively coupled parallel plate PECVD reactor, a low dielectric insulating film was vapor deposited on a bare silicon wafer or glass substrate with a reactant gas mixture of trimethylsilane (3MS), silane (SiH$_4$), nitrous oxide (N$_2$O) and argon (Ar). A vapor deposition temperature was 270° C., and other parameters (i.e., dielectric constant and growth speed) for a PECVD process of the Examples are shown in Table 1.

Light transmittances for the insulating films formed on a glass substrate were measured. All showed a light transmittance of 95% or more at a wavelength range of 400 to 800 nm.

TABLE 1

|      | Electric power | Pressure (Torr) | 3MS (sccm) | N$_2$O (sccm) | Ar (sccm) | SiH$_4$ (sccm) | Total flow rate (sccm) | Vapor deposition speed (nm · min) | Kavg |
|------|----------------|-----------------|------------|---------------|-----------|-----------------|------------------------|-----------------------------------|-------|
| Exam. 1 | 1500 | 2.5 | 375 | 1688 | 750 | 187.5 | 3000 | 1.006 | 3.119 |
| 2 | 1500 | 2.5 | 375 | 2813 | 1100 | 187.5 | 4475 | 1.08 | 3.375 |
| 3 | 1500 | 2.5 | 375 | 3938 | 1500 | 187.5 | 6000 | 1.04 | 3.520 |
| 4 | 1500 | 2.5 | 375 | 2250 | 1000 | 375 | 4000 | 1.248 | 3.216 |
| 5 | 1500 | 2.5 | 375 | 3750 | 1500 | 375 | 6000 | 1.296 | 3.621 |
| 6 | 1500 | 2.5 | 375 | 5250 | 2000 | 375 | 8000 | 1.266 | 3.897 |
| 7 | 1500 | 2.5 | 375 | 1125 | 500 | 0 | 2000 | 0.506 | 3.043 |
| 8 | 1500 | 2.5 | 375 | 1875 | 800 | 0 | 3050 | 0.644 | 3.121 |
| 9 | 1500 | 2.5 | 375 | 2625 | 1000 | 0 | 4000 | 0.728 | 3.173 |

Figure 2:
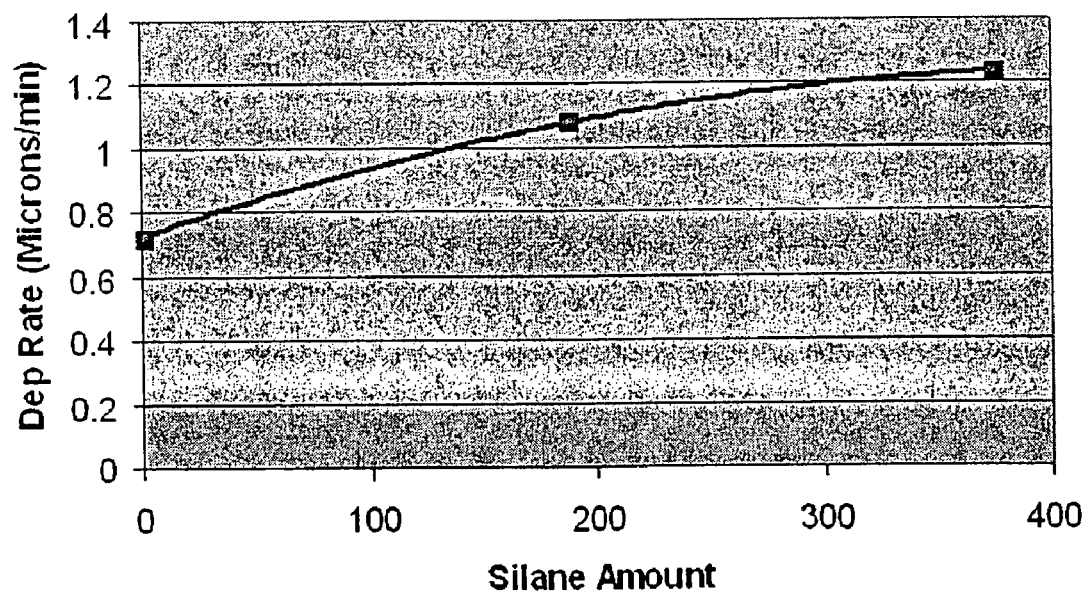
FIG. 2 shows effects of improvement in a—SiCOH thin film vapor deposition speed according to the addition of silane ($SiH_4$) gas.
Figure 3:
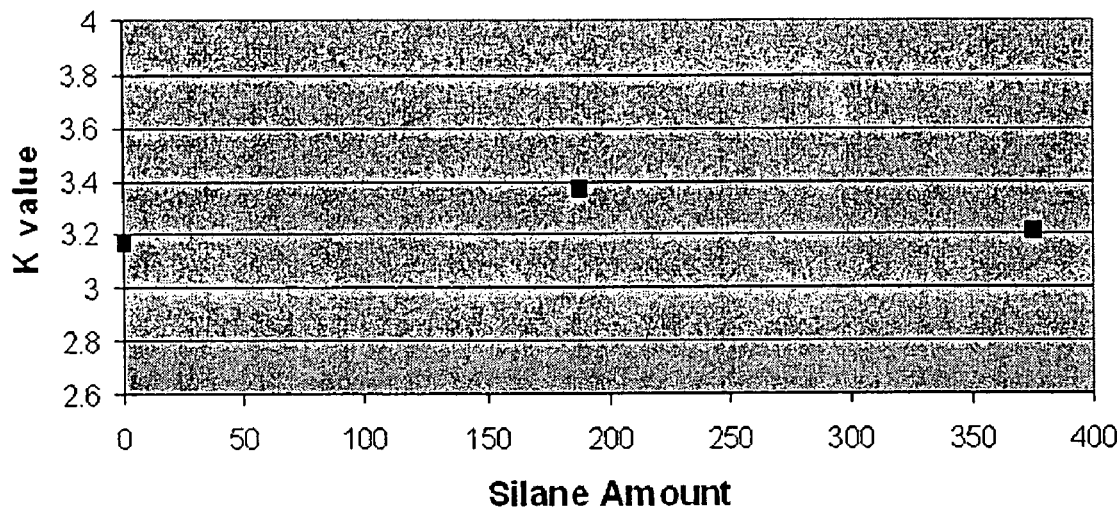
FIG. 3 shows changes in a dielectric constant of a—SiCOH thin film according to the addition of silane ($SiH_4$) gas.

As shown in FIG. 2, the vapor deposition speed increased by approximately 60% or more by adding SiH$_4$ gas to source gas. If other vapor deposition parameters are favorably controlled, the dielectric constant (k) can be constantly maintained even if the amount of SiH$_4$ increases (FIG. 3).

Figure 4:
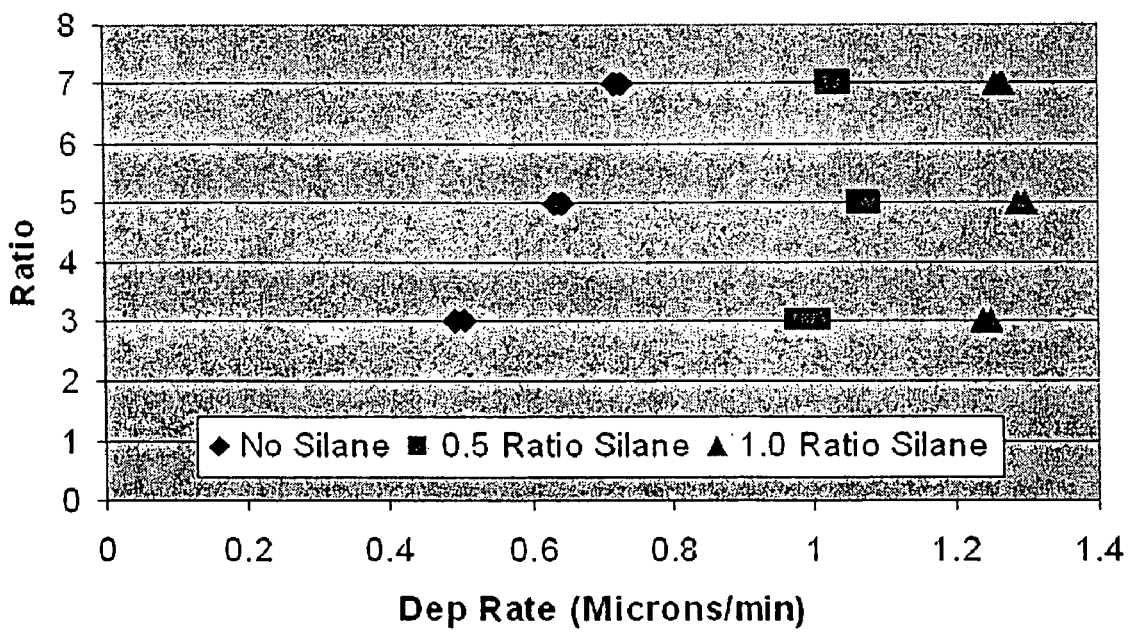
FIG. 4 shows changes in a—SiCOH thin film vapor deposition speed according to the addition of silane ($SiH_4$) gas and a flow rate of $N_2O$.

FIG. 4 shows changes in a vapor deposition speed for a—SiCOH thin film according to the addition of SiH$_4$ and a flow rate of oxidant, in the case of not adding SiH$_4$ (blue diamonds), adding SiH$_4$ corresponding to ½ of main source gas (red squares), and adding SiH$_4$ in the same amount of source gas (green triangles). Vertical axis (y) represents the ratio of oxidant N$_2$O gas to Si containing gas [Z3MS+SiH$_4$].

As shown in FIG. 4, the vapor deposition speed is also related to the flow rate of N$_2$O. In the case where SiH$_4$ is not added, as the ratio of oxidant/source gas (for example, N$_2$O/Z3MS) increases, the vapor deposition speed tends to increase. However, in the case where SiH$_4$ is added, even if the flow rate of an oxidant (for example, N$_2$O) increases, the vapor deposition speed changes little. Therefore, it is clear that vapor deposition speed improvement effects predominantly result from the addition of SiH$_4$ rather than control of the flow rate of an oxidant.

Figure 5:
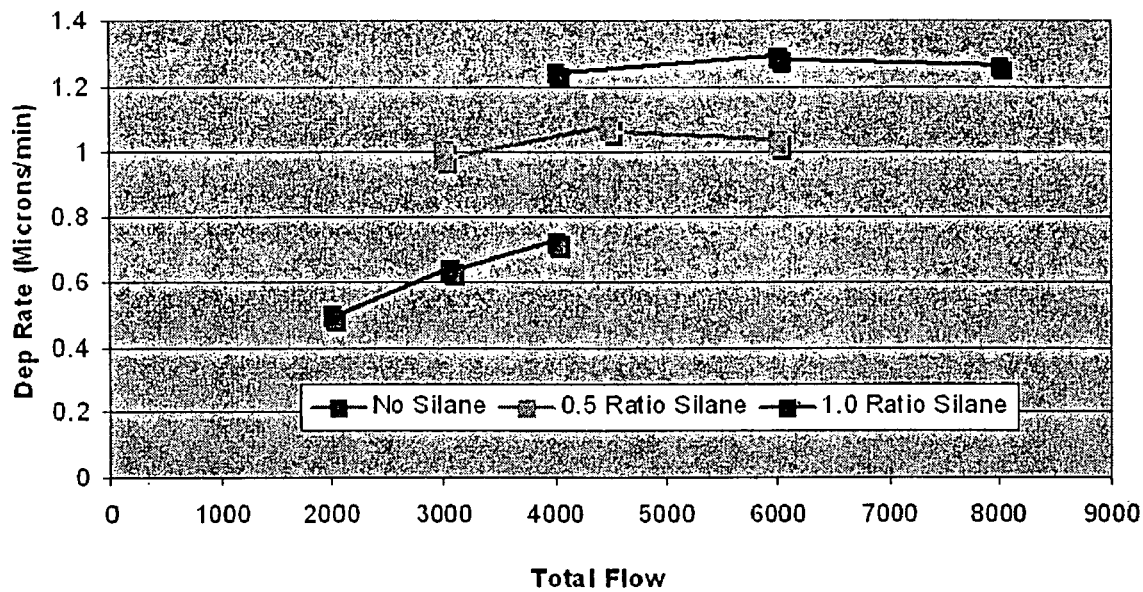
FIG. 5 shows changes in a vapor deposition speed according to flow rates of total source gases [Z3MS+$N_2O$+$SiH_4$]
Figure 6:
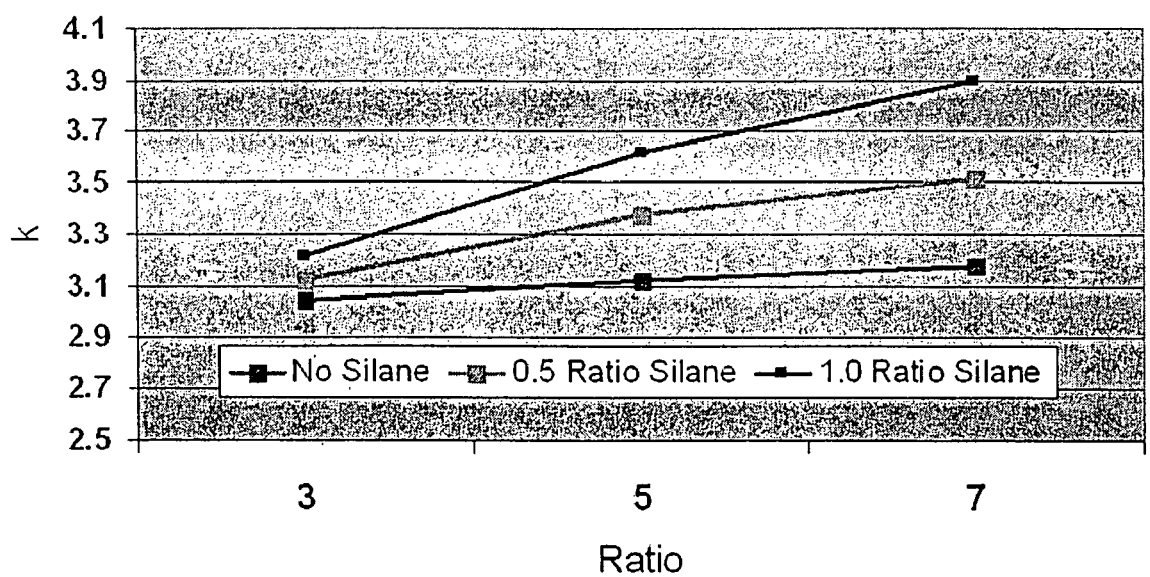
FIG. 6 shows changes in a dielectric constant of a—SiCOH thin film according to the addition of silane ($SiH_4$) gas and a flow rate of $N_2O$.

FIG. 5 shows changes in the vapor deposition speed when increasing the total flow rate [source gas+oxidant+SiH$_4$] by 1.5 and 2 times at each different level of SiH$_4$ amount. In the case where SiH$_4$ is not added, when the flow rate [source gas+oxidant] increases by 1.5 times (2000 sccm ->3000 sccm), the vapor deposition speed merely increases by about 25%. However, when SiH$_4$ is added instead of source gas and the total flow rate increases to 3000 sccm, the vapor deposition speed increases by about 100%. Further, in the case where SiH$_4$ is added, the vapor deposition speed changes little with changes in the total flow rate, and thus it is confirmed that the effects of the addition of SiH$_4$ are dominant. FIG. 6 shows changes in a dielectric constant of a—SiCOH thin film according to the addition of SiH$_4$ and a flow rate of an oxidant in the different instances of when SiH$_4$ is not added, when SiH$_4$ is added corresponding to ½ of a source gas, and when SiH$_4$ is added in the same amount of the source gas. The horizontal axis (x) represents a ratio of an oxidant (N$_2$O): (source gas+SiH$_4$).

As shown in FIG. 6, although changes in the dielectric constant according to the addition of SiH$_4$ is slight within an experimental error range when the ratio of oxidant to Si containing gas [N$_2$O/(Z3MS+SiH$_4$)] is 3, when the ratio increases, the addition of SiH$_4$ results in a corresponding increase in the dielectric constant. Therefore, if the ratio of [N$_2$O/(Z3MS+SiH$_4$)] is controlled to within 3, the vapor deposition speed can be significantly improved while maintaining a low dielectric constant by the addition of SiH$_4$.

Examples 10 to 14

Referring to the attached figures, a thin film transistor substrate with a low resistance wiring structure according to the Examples of the present invention using the low dielectric insulating film as a protection film, and a preparation method thereof will be explained in detail. The explanation will be such that a person having ordinary knowledge in the art to which the present invention pertains can easily carry out the disclosure.

Figure 7:
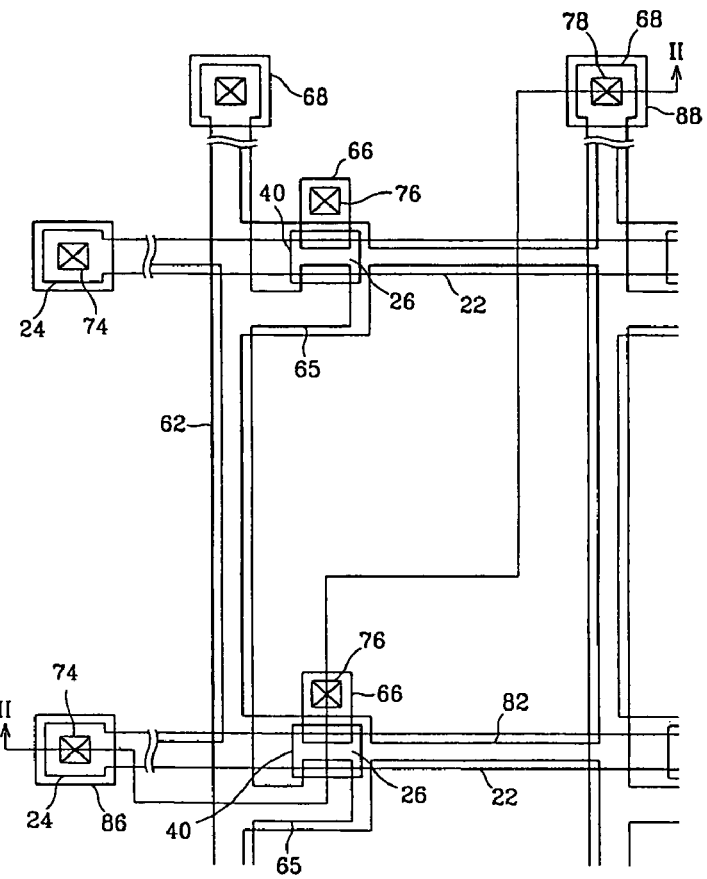
FIG. 7 shows a thin film transistor substrate for a liquid crystal display according to Example 10 of the present invention.
Figure 8:
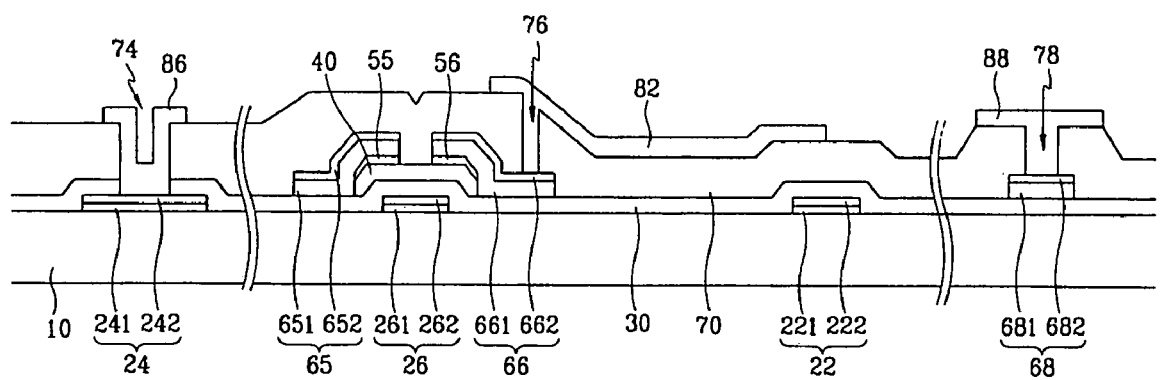
FIG. 8 is a cross sectional view taken along line II-II of FIG. 7.

Referring to FIGS. 7 and 8, the structure of the thin film transistor substrate according to Example 10 of the present invention will be explained in detail.

FIG. 7 shows a thin film transistor substrate for a liquid crystal display according to Example 10 of the present invention, and FIG. 8 is a cross sectional view taken along line II-II of the thin film transistor substrate shown in FIG. 7.

On an insulating substrate (10), gate wiring comprised of double layers of first gate wiring layers (221, 241, 261) made of a Cr or Mo alloy, etc. and second gate wiring layers (222, 242, 262) made of an Al or Ag alloy, etc. is formed. The gate wiring comprises gate lines (22) extending horizontally, gate pads (24) connected to an end of the gate lines (22) and receiving gate signals to transmit the same to the gate lines (22), and gate electrodes (26) of a thin film transistor connected with the gate lines (22).

On the substrate (10), a gate insulating film (30) made of silicon nitride (SiN$_x$), etc. covers the gate wiring elements (22, 24, 26).

On areas of the gate insulating film (30) formed on the gate electrodes (26), a semiconductor layer (40) made of semiconductor such as amorphous silicon is formed. Also, ohmic contact layers (54, 56) made of material such as n+hydrogenate amorphous silicon doped with silicide or n-type impurities at high concentration are formed on the semiconductor layers (40).

On the ohmic contact layers (54, 56) and the gate insulating film (30), data wiring (62, 65, 66, 68) comprised of double layers of first data wiring layers (621, 651, 661, 681) made of a Cr or Mo alloy, etc. and second data wiring layers (622, 652, 662, 682) made of an Al or Ag alloy, etc. is formed. The data wiring comprises data lines (62) formed vertically and intersected with the gate lines (22) to define pixels, source electrodes (65) that are branched from the data lines (62) and which extend to cover the ohmic contact layers (54), data pads (68) connected to one end of the data lines (62) and receiving pixel signals from an external source, and drain electrodes (66) separated from the source electrodes (65) and formed on the ohmic contact layers (56) opposite the source electrode (65) with respect to the gate electrodes (26).

On the data wiring elements (62, 65, 66, 68) and the semiconductor layer (40) that is not covered by the data wiring elements (62, 65, 66, 68), a protection film (70) is formed. The protection film (70) is made of a—SiCOH film (low dielectric insulating film) vapor deposited by the above process and thus has a low dielectric constant of 2.0 to 3.0. Thus, even if a thickness of the protection film (70) is minimal, parasitic capacitance problems do not occur. Further, the protection film (70) has superior adhesive properties with other films and exceptional step coverage. Also, the protection film (70) has superior heat resistance to organic insulating film because it is an inorganic insulating film. In addition, the a—SiCOH film (low dielectric insulating film) vapor deposited by the above PECVD process is very favorable in terms of process time because it has a 4 to 10 times faster vapor deposition speed or etching speed than silicon nitride film.

On the protection film (70), contact openings (76, 78) respectively exposing the drain electrodes (66) and the data pads (68) are formed, and contact openings (74) exposing the gate pads (24) as well as the gate insulating film (30) is also formed. The contact openings (78, 74) exposing the pads (24, 68) may take on various shapes. For example, the contact openings (78, 74) may be circular or multilateral. Also, the area of the contact openings (78, 74) does not exceed 2 mm×60 μm, and is preferably 0.5 mm×15 μm.

On the protection film (70), electrically connected with the drain electrodes (66) through the contact openings (76), pixel electrodes (82) positioned in pixel regions are formed. Further, on the protection film (70), supplementary gate pads (86) and supplementary data pads (88) respectively connected with the gate pads (24) and the data pads (68) through the contact openings (74, 78) are formed. The pixel electrodes (82) and the supplementary gate and data pads (86, 88) are made of ITO (indium tin oxide) or IZO (indium zinc oxide).

As shown in FIGS. 7 and 8, the pixel electrodes (82) overlap the gate lines (22) to forms capacitors. If a sustain capacity is deficient, wiring for sustain capacity may be added on the same layer as the gate wiring elements (22, 24, 26).

In addition, the pixel electrodes (82) also overlap the data lines (62) to maximize an aperture ratio. Since the dielectric constant of the protection film (70) is low even with the pixel electrodes (82) overlapping the data lines (62) to maximize the aperture ratio, the parasitic capacitance formed between these elements is sufficiently small so as not cause any problems.

Referring to FIG. 7, FIG. 8, and FIGS. 9a to 12b, process for manufacturing the thin film transistor substrate for a liquid crystal display according to Example 10 of the present invention will now be explained.

Figure 9A:
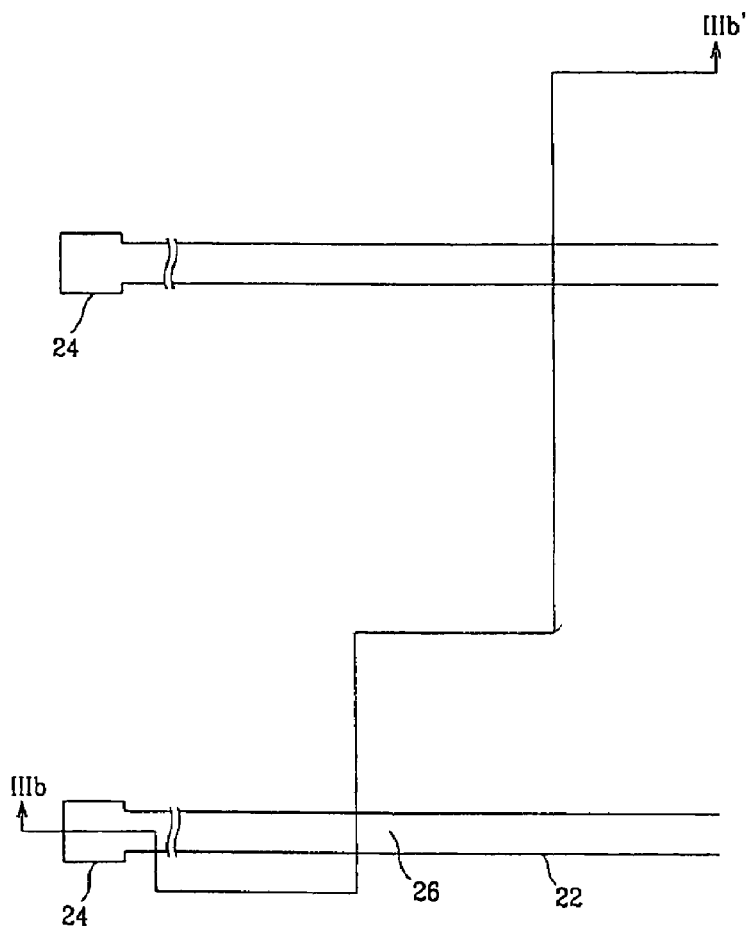
FIGS. 9a, 10a, 11a and 12a are arrangement views of a thin film transistor substrate showing sequential manufacturing processes of a thin film transistor substrate for a liquid crystal display according to Example 10 of the present invention.
Figure 9B:
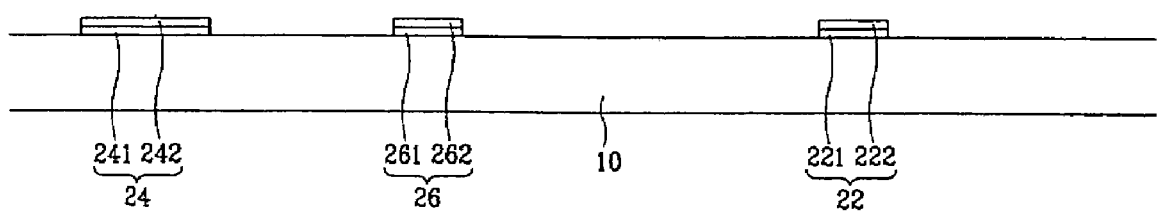
FIG. 9b is a cross sectional view taken along line IIIb-IIIb' of FIG. 9a, FIG. 10b is a cross sectional view taken along line IVb-IVb' of FIG. 10a showing the step following that of FIG. 9b.

As shown in FIGS. 9a and 9b, a Cr or Mo alloy having superior physicochemical properties is vapor deposited on a substrate (10) to stack first gate wiring layers (221, 241, 261), and Al or Ag with a low resistance or an alloy comprising these chemical elements is vapor deposited to stack second gate wiring layers (222, 242, 262), after which these structural elements are patterned to form gate wiring extending horizontally comprising gate lines (22), gate electrodes (26) and gate pads (24).

In the case where the first wiring layers (221, 241, 261) are formed of a Mo alloy and the second wiring layers (222, 242, 262) are formed of an Ag alloy, both of the layers are etched by a mixture of phosphoric acid, nitric acid, acetic acid, and deionized water as Ag alloy etching agent. Thus, the gate wiring elements (22, 24, 26) of double layers can be formed in one etching process. Further, since the etching ratio by a mixture of phosphate, nitrate, acetate, and deionized water for an Ag alloy is larger than that for a Mo alloy, the gate wiring can be formed in a tapered shape.

Figure 10A:
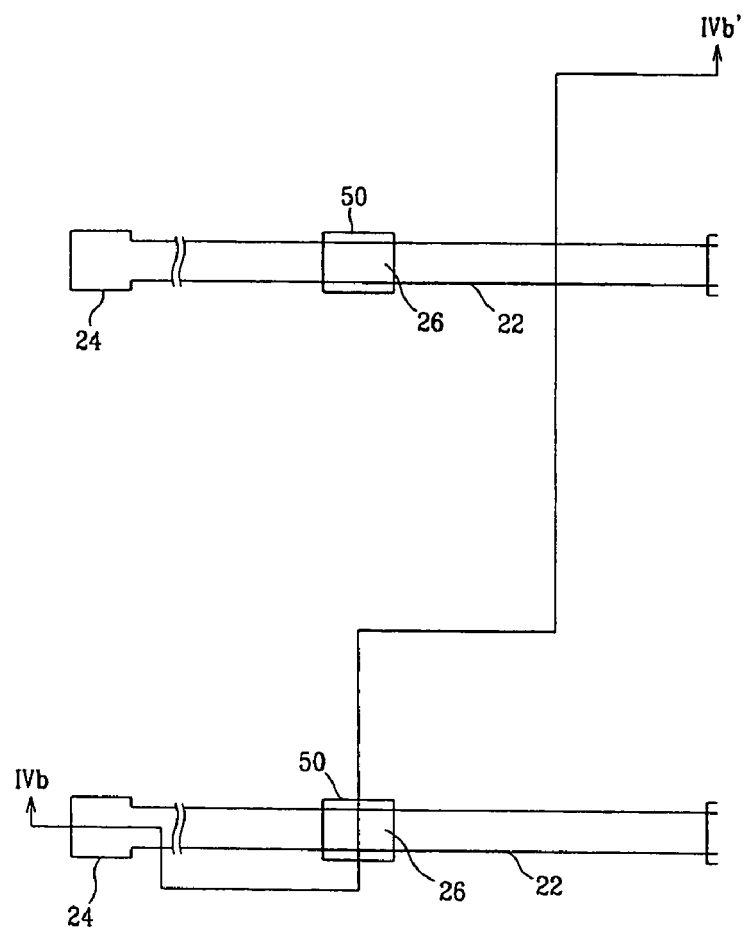
Figure 10B:
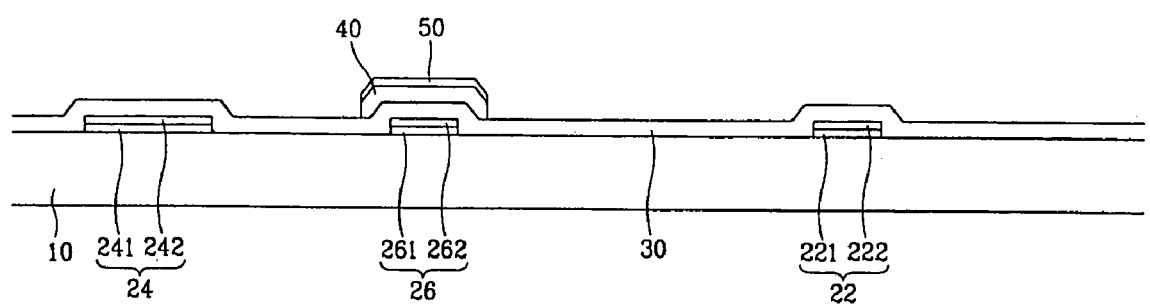

Next, as shown in FIGS. 10a and 10b, a triple films of an insulating film (30) made of silicon nitride, a semiconductor layer (40) made of amorphous silicon, and doped amorphous silicone layer (50) are sequentially stacked, and the semiconductor layer (40) and the doped amorphous silicone layer (50) are photo etched to form semiconductor layers (40) and ohmic contact layers (50) on the gate insulating film (30) at areas of the insulating film (30) formed on the gate electrodes (26).

Figure 11A:
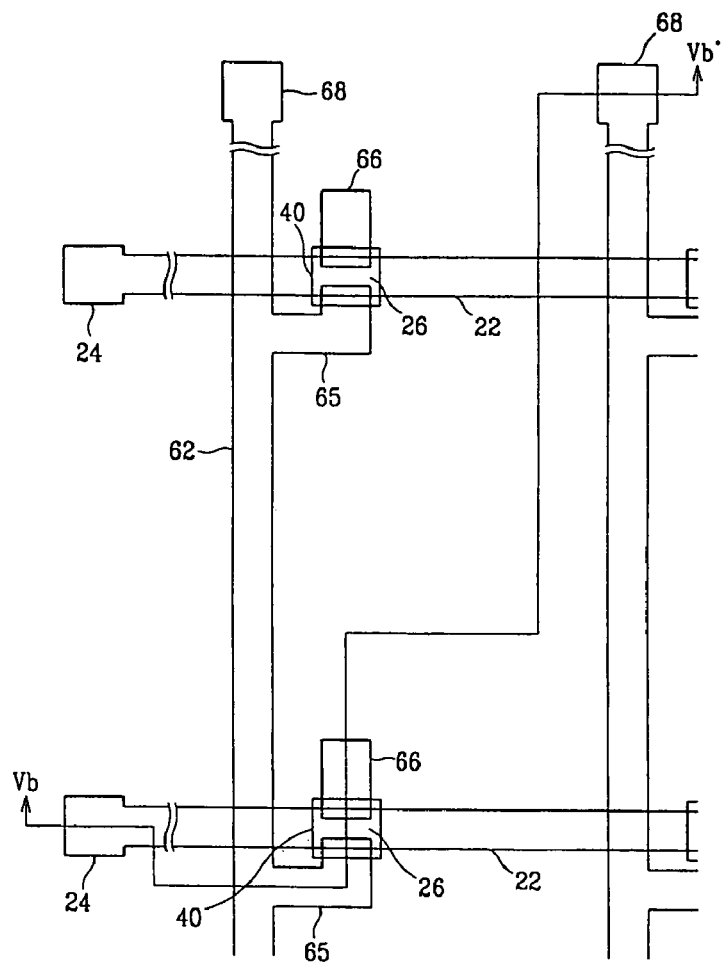
Figure 11B:
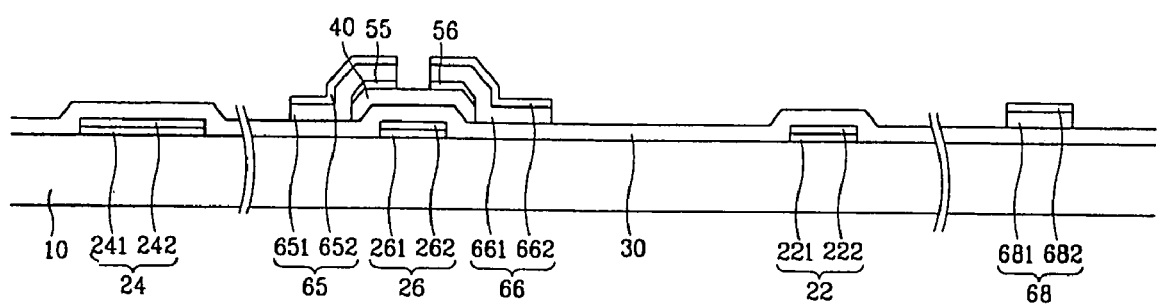
FIG. 11b is a cross sectional view taken along line Vb-Vb' line of FIG. 11b showing the step following that of FIG. 10b.

Next, as shown in FIGS. 11a and 11b, a Cr or Mo alloy is vapor deposited to stack first data wiring layers (651, 661, 681), and an Al or Ag alloy is vapor deposited to stack second data wiring layers (652, 662, 682), after which these structural elements are photo etched to form data wiring comprising data lines (62) intersected with the gate lines (22), source electrodes (65) connected with the data lines (62) and which extend to partially cover the gate electrodes (26), data pads (68) connected to one end of the data lines (62), and drain electrodes (66) separated from and opposite the source electrodes (65) with respect to the gate electrodes (26).

Subsequently, the doped amorphous silicon layer pattern (50) that is not covered by the data wiring elements (62, 65, 66, 68) is etched to separate into two parts about the gate electrodes (26) and so that the semiconductor layer pattern (40) between both the doped amorphous silicon layers (55, 56) are exposed. In order to stabilize a surface of the exposed semiconductor layers (40), it is preferable to expose semiconductor layers 40 with oxygen plasma.

Figure 12A:
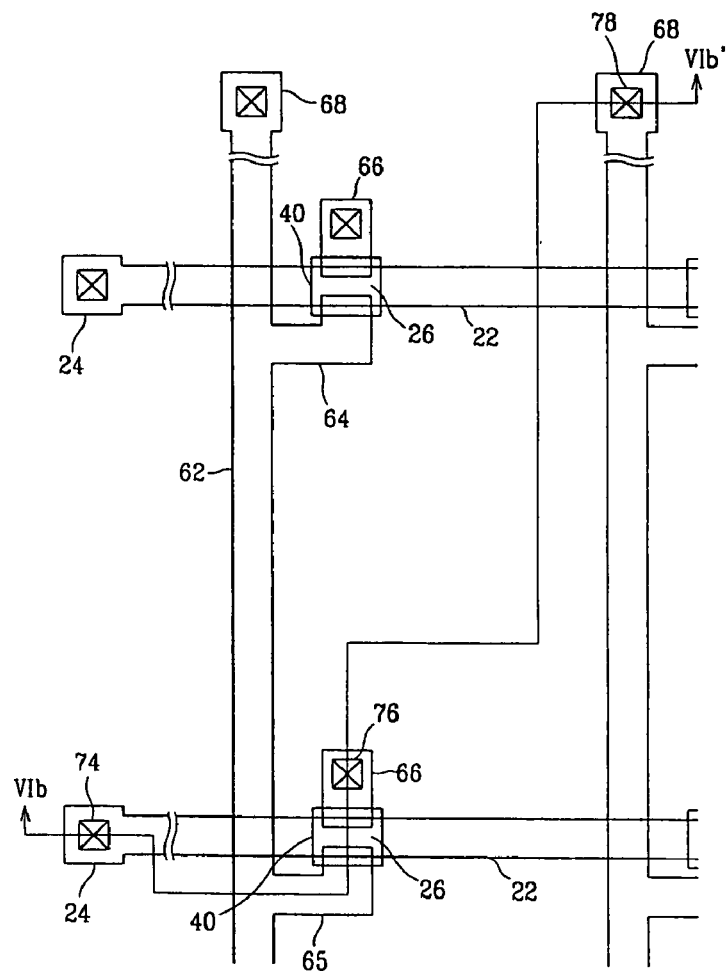
Figure 12B:
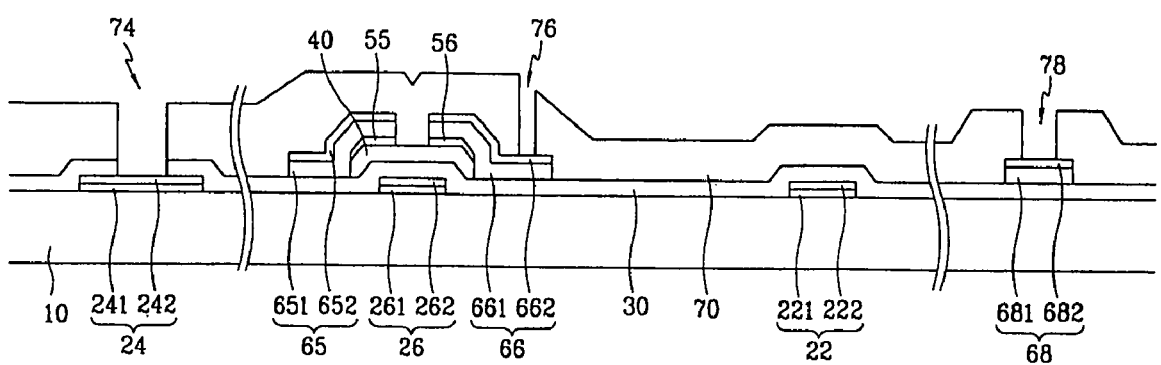
FIG. 12b is a cross sectional view taken along line VIb-VIb' of FIG. 12a showing the step following that of FIG. 12.

Following the above processes, as shown in FIGS. 12a and 12b, a—SiCOH film (low dielectric CVD film) is grown by a CVD or PECVD process to form a protection film (70). This is performed by vapor depositing using a CVD or PECVD process by adding a reactant gas mixture of a main source of at least one of the compounds of the above Chemical Formulae 1 to 3, the oxidant, gas such as Ar or He, and SiH$_4$. As the main source, at least one of SiH(CH$_3$)$_3$, SiO$_2$(CH$_3$)$_4$, (SiH)$_4$O$_4$(CH$_3$)$_4$, and Si(C$_2$H$_5$O)$_4$ is as the oxidant, N$_2$O or O$_2$ is used.

Next, the protection film (70) is patterned together with the gate insulating film (30) by a photo etching process to form contact openings (74, 76, 78) exposing the gate pads (24), the drain electrodes (66), and the data pads (68). The contact openings (74, 76, 78) may be multilateral or circular in shape, and the area of the contact openings (74, 78) exposing pads (24, 68) does not exceed 2 mm×60 μm, and is preferably 0.5 mm×15 μg or more.

Finally, as shown in FIGS. 7 and 8, an ITO or IZO film is vapor deposited and photo etched to form pixel electrode (82) connected with the drain electrodes (66) through the first contact openings (76), and supplementary gate pads (86) and supplementary data pads (68) respectively connected with the gate pads (24) and the data pads (68) through the second and third contact openings (74, 78). Nitrogen is preferably used as the gas used in a pre-heating process before stacking ITO or IZO. This prevents a metal oxidation film from forming on the upper part of metal films (24, 66, 68) exposed through the contact openings (74, 76, 78).

As explained above, parasitic capacitance problems can be solved by using a low dielectric insulating film that is vapor deposited according to the process of the present invention as the protection film (70), thereby maximizing the aperture ratio. In addition, the process time can be reduced because vapor deposition and etching speeds are fast.

The process, as explained, can be applied for a manufacturing process using 5 sheets of masks, but can also be applied for a manufacturing process of a thin film transistor substrate for a liquid crystal display using 4 sheets of masks in the same manner. This will be explained in detail with reference to the drawings.

First, referring to FIGS. 13 to 15, a unit pixel structure of the thin film transistor substrate for a liquid crystal display manufactured using 4 sheets of masks according to the present invention will be explained.

Figure 13:
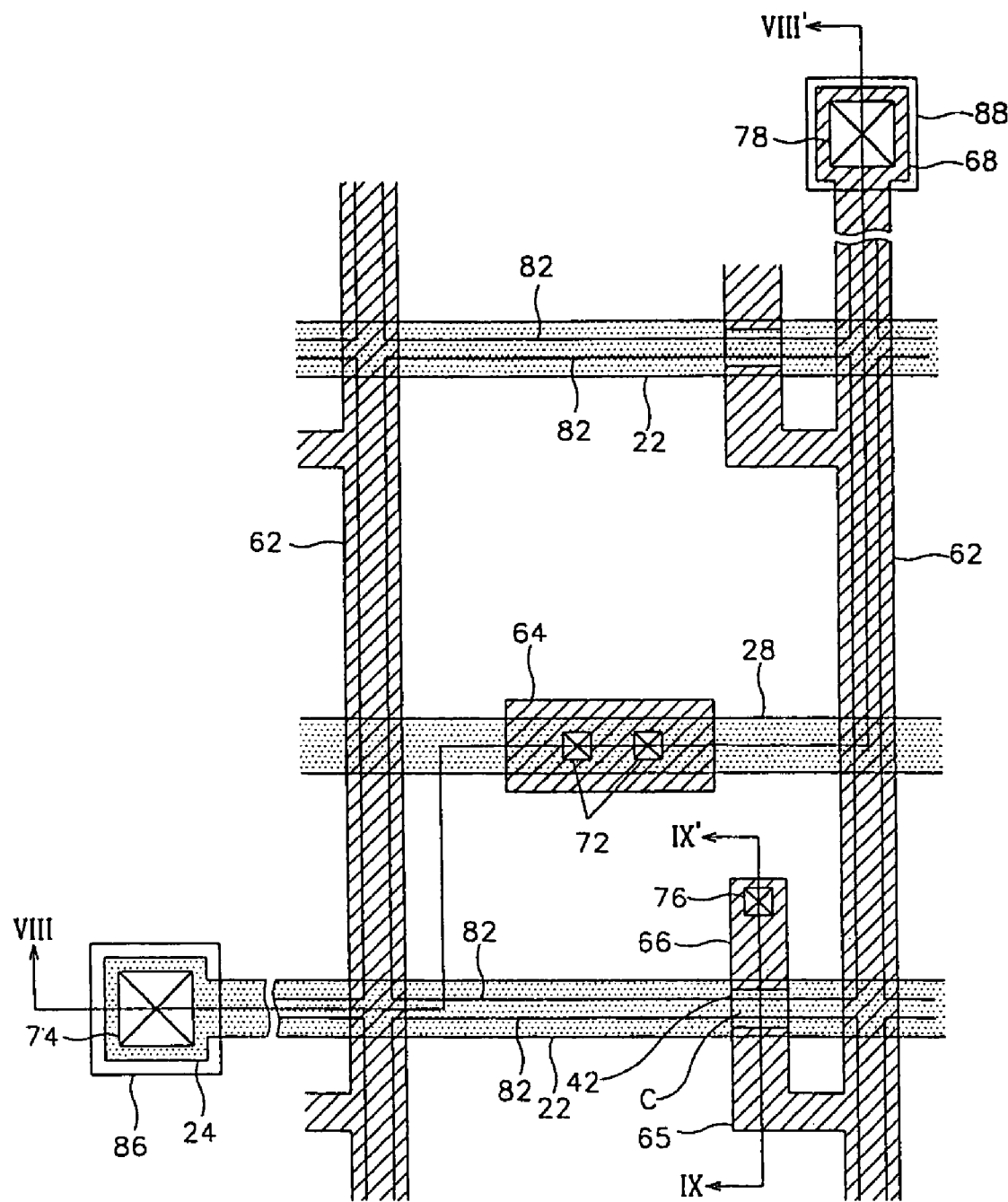
FIG. 13 is arrangement view of a thin film transistor substrate for a liquid crystal display according to Example 11 of the present invention.
Figure 14:
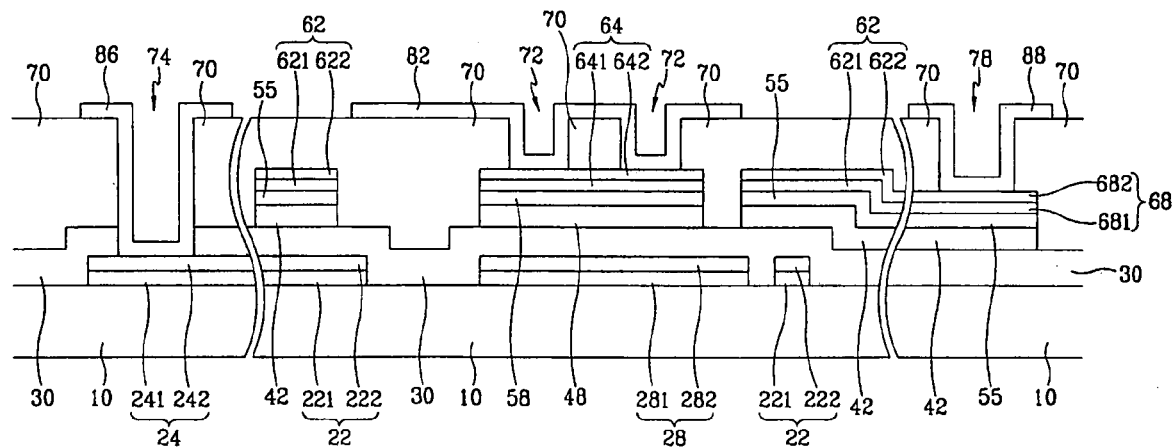
FIG. 14 and FIG. 15 are respectively cross sectional views taken along line VII-VII' and line IX-IX' of FIG. 13.
Figure 15:
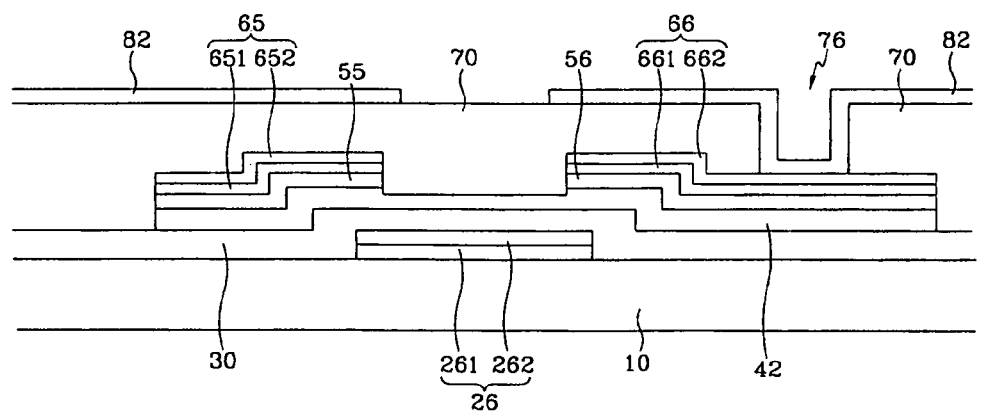

FIG. 13 is an arrangement view of the thin film transistor substrate for a liquid crystal display according to Example 11 of the present invention, and FIG. 14 and FIG. 15 are cross sectional views of the thin film transistor substrate shown in FIG. 13 respectively taken along line VIII-VIII' and line IX-IX' line.

On an insulating substrate (10), gate wiring comprised of double layers of first gate wiring layers (221, 241, 261) made of a Cr or Mo alloy and second gate wiring layers made of an Al or Ag alloy is formed in the same manner as in Example 10. The gate wiring comprises gate lines (22), gate pads (24), and gate electrodes (26).

On the substrate (10), maintenance electrode lines (28) are formed parallel to the gate lines (22). Each of the maintenance electrode lines (28) is also comprised of double layers of a first gate wiring layer (281) and a second gate wiring layer (282). The maintenance electrode lines (28) are overlapped with a conductor pattern (68), which is used for maintenance capacitors and connected to pixel electrodes (82), to form maintenance capacitors for improving a charge maintaining capacity of pixels. It is possible to forgo formation of the maintenance electrode lines (28) if a maintenance capacity produced by the overlapping of the pixel electrodes (82) and gate lines (22) is sufficient. The same voltage as applied to the common electrode of the upper substrate is commonly applied to the maintenance electrode lines (28).

On the gate wiring elements (22, 24, 26) and the maintenance electrode lines (28), a gate insulating film (30) made of silicon nitride (SiNx) is formed to thereby cover the gate wiring elements (22, 24, 26) and the maintenance electrode lines (28).

On the gate insulating film (30), semiconductor patterns (42, 28) made of semiconductor such as hydrogenated amorphous silicon are formed, and on the semiconductor patterns (42, 28), middle layer patterns (55, 56, 58) or ohmic contact layer patterns made of amorphous silicon doped with n-type impurities such as phosphorous at a high concentration are formed.

On the ohmic contact layer patterns (55, 56, 58), data wiring (62, 64, 65, 66, 68) comprised of double layers of first data wiring layers (621, 641, 661, 681) made of a Cr or Mo alloy and second data wiring layers (622, 642, 652, 662, 682) made of an Al or Ag alloy is formed. The data wiring comprises data line elements including data lines (62) formed vertically, data pads (68) connected to one end of the data lines (62) to receive external pixel signals, and source electrodes (65) of thin film transistors that are branched from the data lines (62). The data wiring also comprises drain electrodes (66) separated from the data line elements (62, 68, 65) and located opposite to the source electrodes (65) with respect to the gate electrodes (26) or a channel area (C) of thin film transistor, and conductor patterns (64) used for maintenance capacitors and located on the maintenance electrode lines (28). If the maintenance electrode lines (28) are not formed, the conductor patterns (64) used for maintenance capacitors are also not formed.

The data wiring elements (62, 64, 65, 66, 68) can be formed in a single layer of Al or Ag in the same manner as in Example 10.

The contact layer patterns (55, 56, 58) reduce a contact resistance of the semiconductor patterns (42, 48) formed under the contact layer patterns (55, 56, 58) and of the data wiring elements (62, 64, 65, 66, 68) formed on the contact layer patterns (55, 56, 58), and are shaped identically as the data wiring elements (62, 64, 65, 66, 68). Specifically, the middle layer patterns (55) are shaped the same as the data line elements (62, 68, 65), the middle layer patterns (56) are shaped the same as the drain electrodes (66), and the middle layer patterns (58) are shaped the same as the conductor patterns (64).

Except for the channel areas (C) of the thin film transistors, the semiconductor patterns (42, 48) have the same shape as the data wiring elements (62, 64, 65, 66, 68) and the ohmic contact layer patterns (55, 56, 58). Specifically, the semiconductor patterns (48), the conductor patterns (64), and the contact layer patterns (58) have the same shape, but the semiconductor patterns (42) slightly differs from the remaining part of the data wiring and contact layer pattern. Specifically, from the channel areas (C) of thin film transistors, the data line elements (62, 68, 65), particularly the source electrodes (65) and the drain electrodes (66) are separated, and the middle layers (56) and the contact layer patterns (56) are also separated, but the semiconductor patterns (42) are not disconnected but connected to produce a channel for thin film transistors.

On the data wiring elements (62, 64, 65, 66, 68), a protection film (70) made of a—SiCOH film (low dielectric insulating film) vapor deposited by the above process is formed. Thus, even if a thickness of the protection film (70) is minimal, parasitic capacitance problems do not occur. Further, the protection film (70) has superior step coverage and adhesive properties with other films. Also, the protection film (70) has superior heat resistance to organic insulating film because it is an inorganic insulating film. The low dielectric insulating film has a dielectric constant of 2 to 3.

The protection film (70) has contact openings (76, 78, 72) for exposing the drain electrodes (66), data pads (68), and conductor patterns (64), and also has a contact opening (74) for exposing gate pads (24) together with gate insulating film (30).

On the protection film (70), pixel electrodes (82) receiving pixel signals from the thin film transistors to produce electrical fields together with electrodes of an upper substrate are formed. The pixel electrodes (82) are made of transparent conductive material such as ITO or IZO, and are physically and electrically connected with the drain electrodes (66) through the contact openings (76) to receive pixel signals. The pixel electrodes (82) also overlap neighboring gate lines (22) and data lines (62) to increase the aperture ratio. However, it is not absolutely necessary that the pixel electrodes (82) overlap these elements. Further, the pixel electrodes (82) are also connected with the conductor patterns (64) through the contact openings (72) to transmit pixel signals to the conductor patterns (64). On the gate pads (24) and data pads (68), supplementary gate pads (86) and supplementary data pads (88) connected to the gate pads (24) and the data pads (68), respectively, through the contact openings (74, 78) are formed. The supplementary gate and data pads (86, 88) complement adhesive properties between the gate and data pads (24, 68) and an external circuit apparatus, and also protect the gate and data pads (24, 68). However, the application of the supplementary gate and data pads (86, 88) is optional.

Referring to FIGS. 13 to 15 and FIGS. 16a to 23c, processes for manufacturing a thin film transistor substrate for a liquid crystal display with a structure of FIGS. 13 to 15 using 4 sheets of masks will now be explained.

Figure 16A:
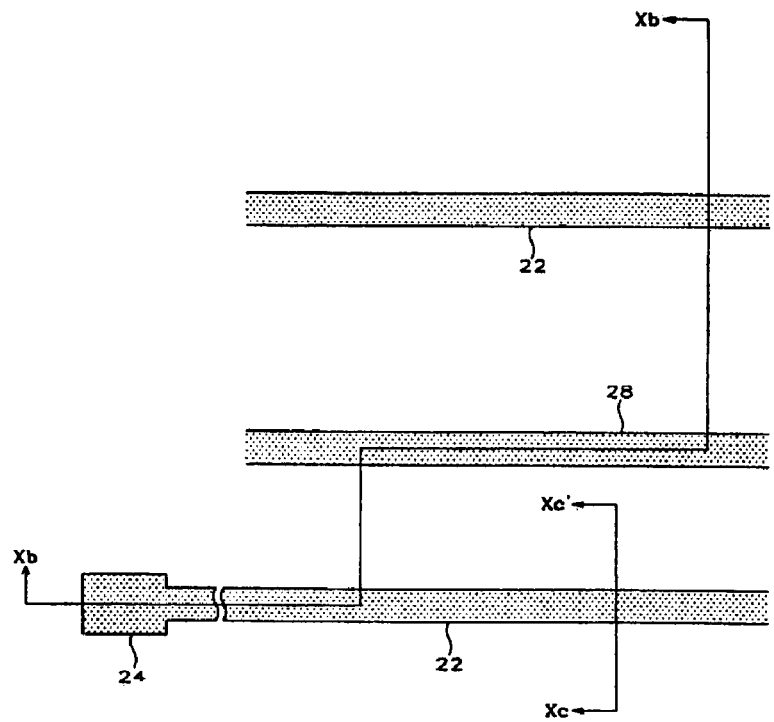
FIG. 16a is an arrangement view of the thin film transistor substrate of Example 11 of the present invention in a first manufacturing step.
Figure 16B:
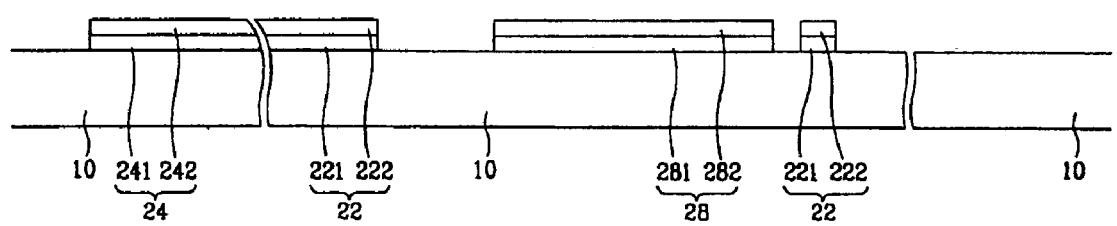
Figure 16C:
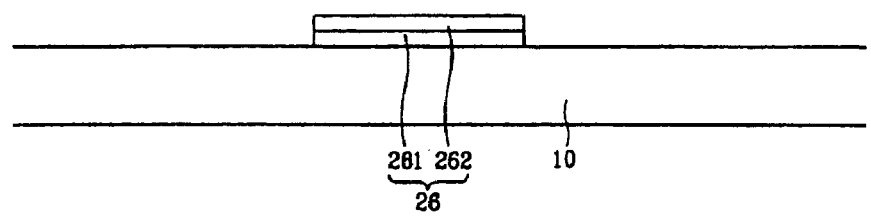

First, as shown in FIGS. 16a to 16c, a Cr or Mo alloy having superior physicochemical properties is vapor deposited to stack first wiring layers (221, 241, 261, 281), and an Al or Ag alloy with a low resistance is vapor deposited to stack second gate wiring layers (222, 242, 262, 282), after which these elements are photo-etched to form gate wiring comprising gate lines (22), gate pads (24) and gate electrodes (26), and to form maintenance electrode lines (28) in the same manner as Example 10.

Figure 17A:
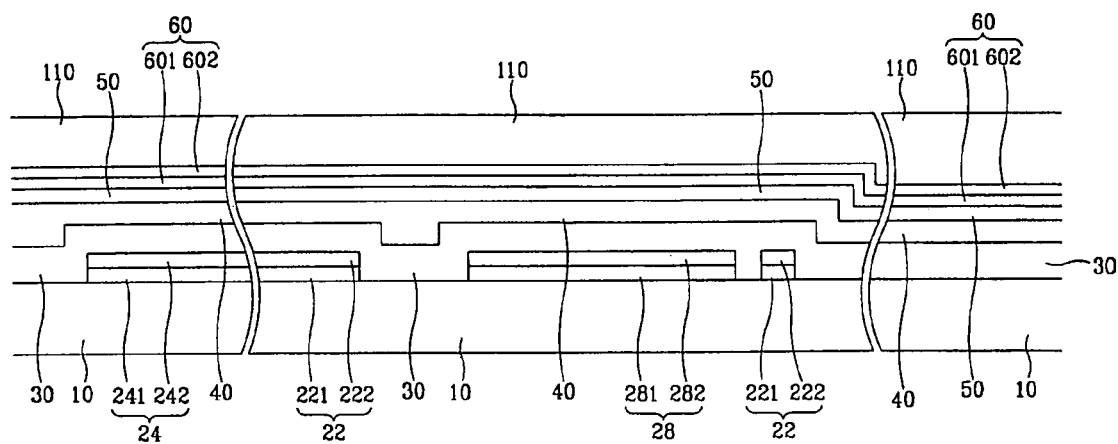
FIG. 17a and FIG. 17b are respectively cross sectional views taken along line Xb-Xb' and line Xc-Xc' of FIG. 16a, showing the step following that of FIG. 16b and FIG. 16c.
Figure 17B:
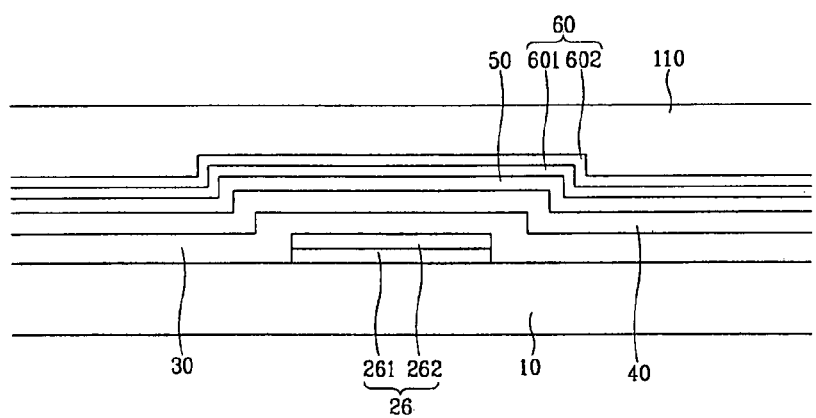

Next, as shown in FIGS. 17a and 17b, a gate insulating film (30) made of silicon nitride, a semiconductor layer (40), and a middle layer (50) are sequentially vapor deposited with a thickness of respectively 1,500 to 5,000 Å, 500 to 2,000 Å, and 300 to 600 Å by a chemical gas phase vapor deposition method, and a first conductive film (601) made of a Cr or Mo alloy and a second conductive film (602) made of an Al or Ag alloy are vapor deposited by sputtering, etc. to form a conductive layer (60). A photosensitive film (110) is then coated on these elements at a thickness of 1 to 2 μg.

Figure 18A:
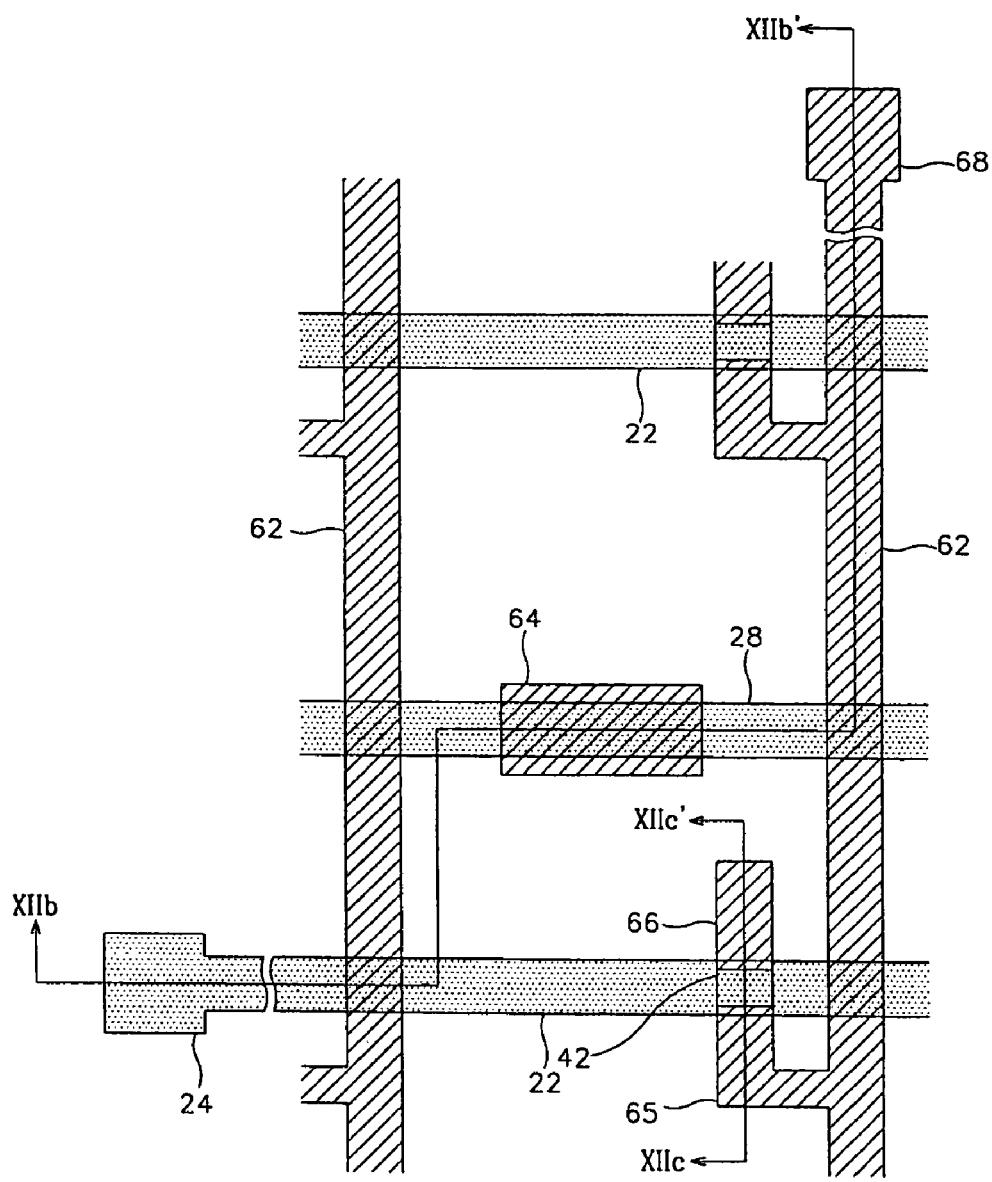
FIG. 18a is an arrangement view of the thin film transistor substrate in a step following that of FIG. 17a and FIG. 17b.
Figure 18B:
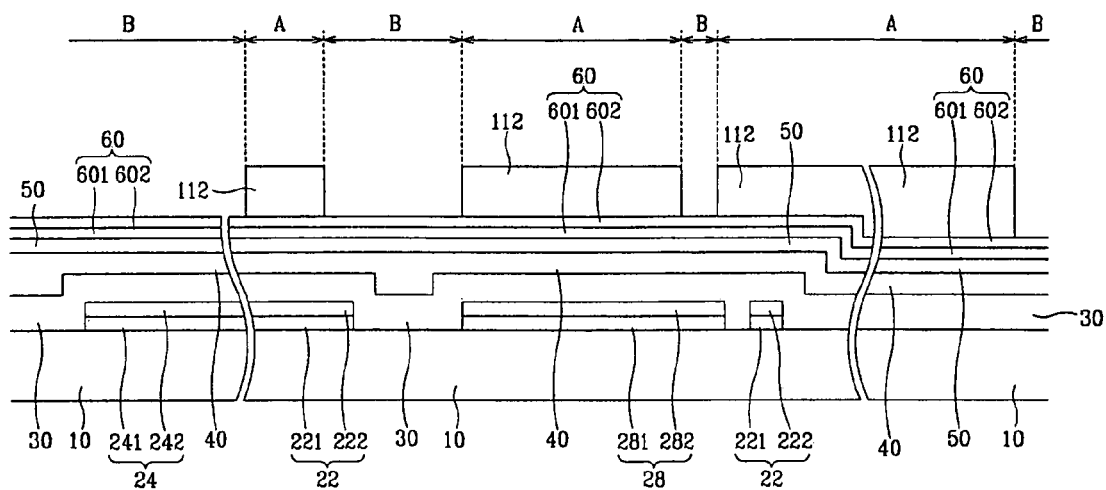
Figure 18C:
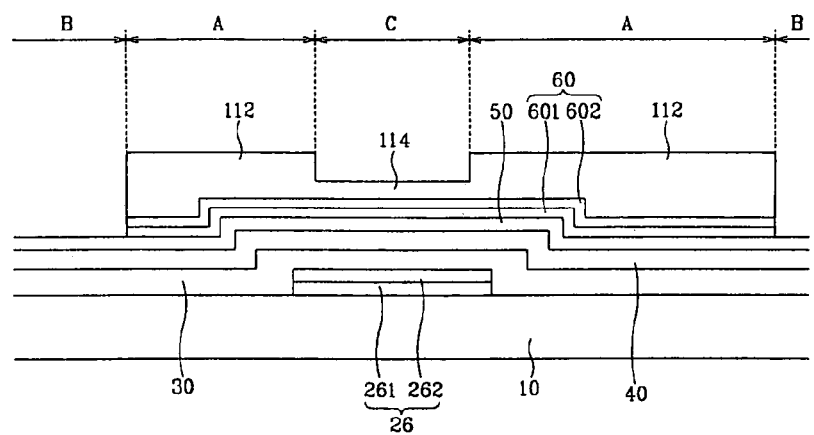

Subsequently, the photosensitive film (110) is irradiated through a mask and developed to form first and second photosensitive film patterns (112, 114) as shown in FIGS. 18b and 18c. Among the photosensitive film patterns (112, 114), the second photosensitive film patterns (114) located in the channel areas (C) of thin film transistors, i.e., between the source electrodes (65) and the drain electrodes (66), are made to be thinner than the first photosensitive film patterns (112) located in data wiring areas (A), i.e., the areas on which data wiring elements (62, 64, 66, 68) are to be formed. The photosensitive film (110) of the remaining areas (B) is completely removed. The ratio of the thickness of the second photosensitive film patterns (114) in the channel areas (C) to that of the first photosensitive film patterns (112) in data wiring areas (A) should be set differently according to process conditions of an etching process (to be described below), and the thickness of the second photosensitive film patterns (114) is preferably ½ or less of the thickness of the first photosensitive film patterns (112), for example, 4,000 Å or less.

In order to change the thickness of the photosensitive film (110) according to its location, various methods can be used, and in order to control a light transmittance in areas (A), a slit or lattice shape pattern is formed or a translucent film is used.

Preferably, a line width of a pattern located between slits or a distance between patterns (i.e., widths of the slits) is smaller than a resolution of exposure equipment used for light exposure. If a translucent film is used, to control transmittance when manufacturing a mask, a thin film with different transmittances can be used or a thin film with different thicknesses can be used.

If light is irradiated onto the photosensitive film through the mask, polymers are completely decomposed at areas directly exposed to light, polymers are not completely decomposed at areas where slit patterns or translucent film is formed because the amount of light irradiated is small, and polymers are decomposed little at areas shielded with a shade. If the photosensitive film is then developed, only the areas where polymers are not decomposed remain, and at centers where little light is irradiated, the photosensitive film remains in a state thinner than non-irradiated areas. If the light exposure time is lengthy, all the molecules are decomposed.

The thin second photosensitive film patterns (114) can be formed using a photosensitive film made of a reflowable material, then after performing light exposure with a conventional mask separated into areas where light can be completely transmitted and areas where light cannot be completely transmitted, developing and reflowing are performed to make a part of the photosensitive film flow down to a part where photosensitive film does not remain.

Following the above, the second photosensitive film patterns (114) and the films located under the same, i.e., the conductor layer (60), the middle layer (50), and the semiconductor layer (40) are etched. In the data wiring areas (A), data wiring and the films under the same should remain intact; in the channel areas (C), only the semiconductor layer should remain; and in the remaining areas (B), the above three layers (60, 50, 40) should be completely removed to expose the gate insulating film (30).

Figure 19A:
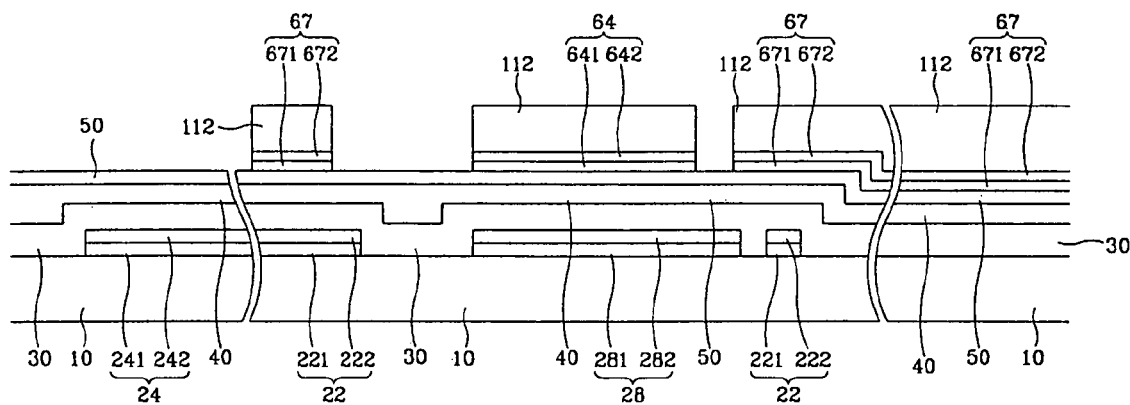
FIGS. 19a, 20a, 21a and FIGS. 19b, 20b, 21b are respectively cross sectional views taken along line XIIb-XIIb' and line XIIc-XIIc' line of FIG. 18a, showing the sequential subsequent steps of FIG. 18b and FIG. 18c.
Figure 19B:
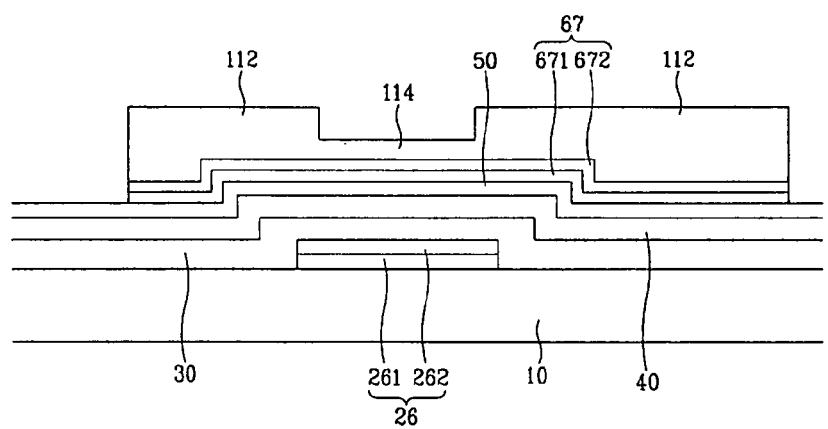

As shown in FIGS. 19a and 19b, the exposed conductor layer (60) of the remaining areas (B) is removed to expose the lower middle layer (50). For this process, a dry etching or wet etching process can be used, and it is preferable to conduct etching such that the conductor layer (60) is etched while the photosensitive film patterns (112, 114) are not etched. However, dry etching may be conducted in such a manner that the photosensitive patterns (112, 114) are also etched in the process since it is difficult to realize conditions in which only the conductor layer (60) is etched while the photosensitive film patterns (112, 114) are left unaffected. In this case, the thickness of the second photosensitive film patterns (114) is made greater than when wet etching so that the conductor layer (60) under the second photosensitive film patterns 114 is not be exposed by removal of the same.

Thus, as shown in FIGS. 19a and 19b, a conductor layer of the data wiring areas (B) and the channel areas (C), i.e., source/drain conductive patterns (67) and maintenance capacitor conductive patterns (68) remain, and the conductive layer (60) of the remaining areas (B) is completely removed to expose the lower middle layer (50). The remaining conductor pattern (67, 64) is of the same shape as the data wiring elements (62, 64, 65, 66, 68), except that source and drain electrodes (65, 66) are not separated but connected. Further, if dry etching is used, the photosensitive film patterns (112, 114) are also etched to certain thicknesses.

Figure 20A:
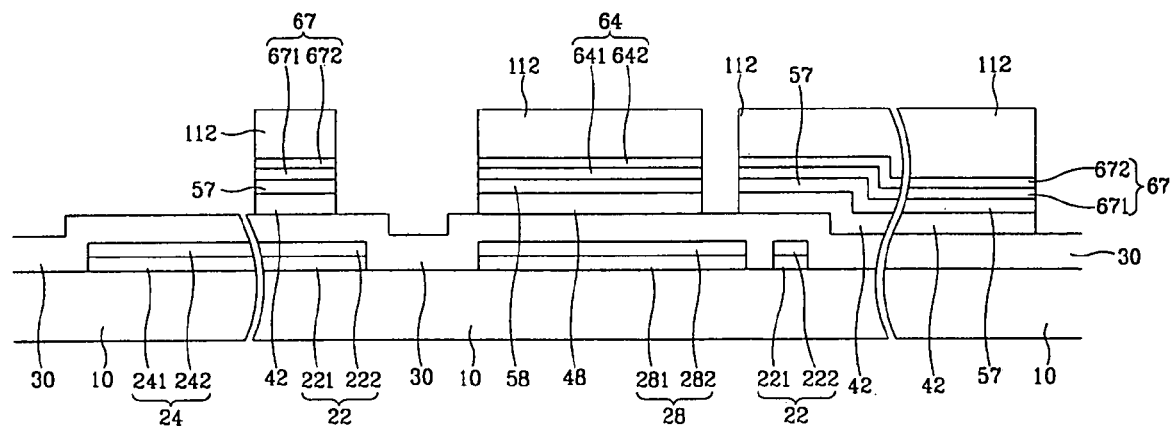
Figure 20B:
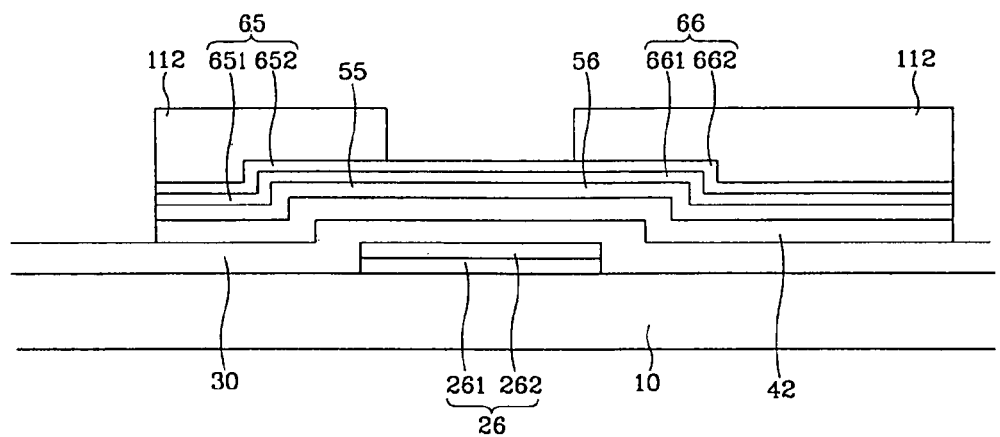

Next, as shown in FIGS. 20a and 20b, the exposed middle layer (50) of the remaining areas (B) and the lower semiconductor layer (40) are removed by dry etching simultaneously with the second photosensitive film patterns (114). The photosensitive film patterns (112, 114), the middle layer (50), and the semiconductor layer (40) (the semiconductor layer and middle layer have no etching selectivity) are simultaneously etched, and the etching should be conducted such that the gate insulating film (30) is not etched, and preferably such that an etching ratio between the photosensitive film patterns (112, 114) and the semiconductor layer (40) are almost the same. For example, two films can be etched to almost the same thickness using a gas mixture of $SF_6$ and HCl or a gas mixture of $SF_6$ and $O_2$. If the etching ratio between the photosensitive film patterns (112,114) and the semiconductor layer (40) are the same, the thickness of the second photosensitive film patterns (114) should be equal to or less than the sum of the thicknesses of the semiconductor layer (40) and that of the middle layer (50).

Thus, as shown in FIGS. 20a and 20b, the second photosensitive film patterns (114) of the channel areas (C) are removed to expose the source/drain conductive patterns (67), and the middle layer (50) and the semiconductor layer (40) of the remaining areas (B) are removed to expose the lower gate insulating film (30). Also, since the first photosensitive film patterns (112) of the data wiring areas (A) are also etched, its thickness is reduced, thereby completing semiconductor patterns (42, 48). Reference numerals 57 and 58 respectively indicate middle layer patterns under the source/drain conductor patterns (67) and middle layer patterns under maintenance capacitor conductor patterns (64).

Subsequently, photosensitive film remnants on the surface of the source/drain conductor patterns (67) of the channel areas (C) are removed through ashing.

Figure 21A:
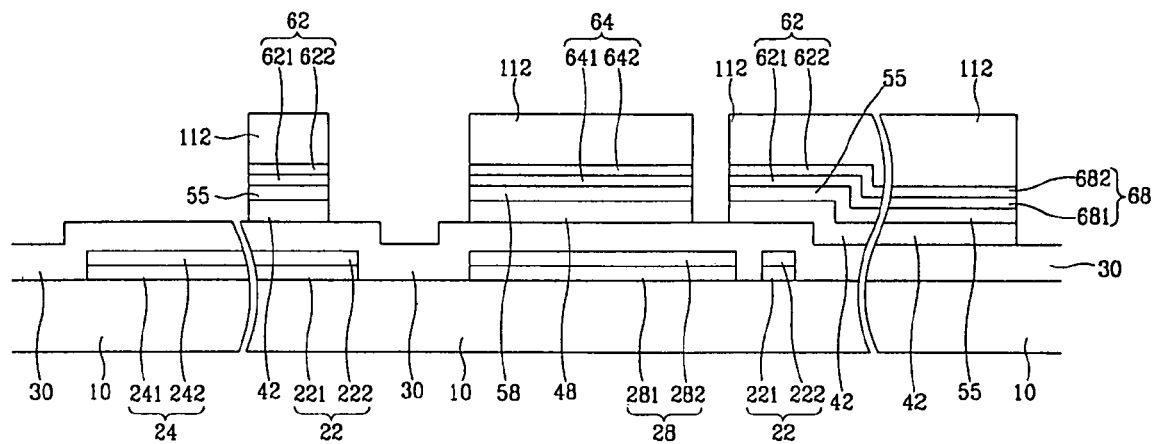
Figure 21B:
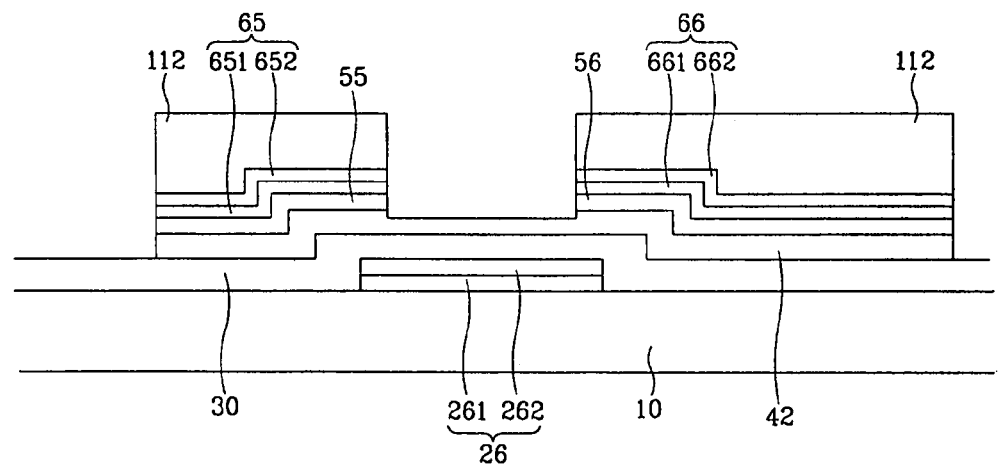

Next, as shown in FIGS. 21a and 21b, the source/drain conductor patterns (67) of the channel areas (C) and the lower source/drain middle layer patterns (57) are etched to remove the same. The etching may be conducted by only dry etching both the source/drain conductor patterns (67) and the middle layer patterns (57), or it may be conducted by wet etching source/drain conductive patterns (67) and dry etching the middle layer patterns (57). In the former case, etching is preferably conducted such that there is a large etching selection ratio between the source/drain conductive patterns (67) and the middle layer patterns (57) because when the etching selection ratio is not large, the etching completion point is difficult to determine and thus the thickness of the semiconductor patterns (42) remaining in the channel areas (C) is not easy to control. In the latter case of using both wet etching and dry etching, the side of the source/drain conductive patterns (67) etched by wet etching is etched, but the middle patterns (57) etched by dry etching is minimally little, thus making stepped shape. As the etching gas used for etching the middle layer patterns (57) and the semiconductor patterns (42), a gas mixture of $CF_4$ and HCl or a gas mixture of $CF_4$ and $O_2$ can be used, and if $CF_4$ and $O_2$ are used, the semiconductor patterns (42) can remain at a uniform thickness. As shown in FIG. 15b, a part of the semiconductor patterns (42) may be removed to make its thickness small and the first photosensitive film patterns (112) are also etched to a certain thickness. The etching should be conducted such that the gate insulating film (30) is not etched, and preferably, the first photosensitive film patterns (112) are thick so that the data wiring elements (62, 64, 65, 66, 68) under the first photosensitive film patterns (112) are not be exposed by etching of the first photosensitive film patterns (112).

Thus, the source electrodes (65) and the drain electrodes (66) are separated to complete the data wiring elements (62, 64, 65, 66, 68) and the lower contact layer patterns (55, 56, 58).

Finally, the first photosensitive film patterns (112) remaining in the data wiring areas (A) are removed. However, the removal of the first photosensitive film patterns (112) can be conducted after removing the source/drain conductor patterns (67) of the channel areas (C) and before removing the lower middle layer patterns (57).

As explained above, dry etching and wet etching can be alternated, or only dry etching can be used. In the latter case, since one kind of etching is used, the process is comparatively simple but suitable etching results are difficult to obtain. In the former case, although suitable etching results are easily obtained, the process is complicated compared to the latter case of using only dry etching.

Figure 22A:
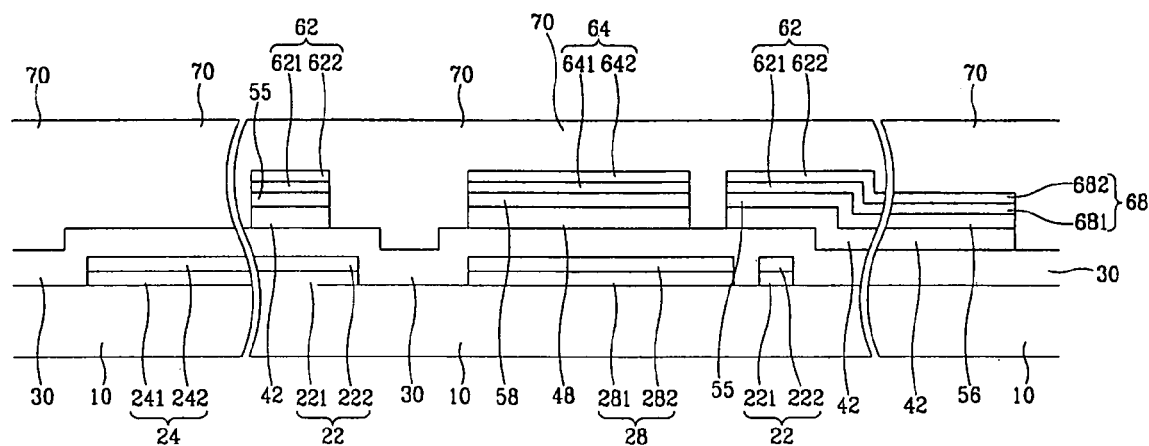
FIG. 22a and FIG. 22b are cross sectional views of the thin film transistor substrate in steps following those of FIG. 21a and FIG. 21b.
Figure 22B:
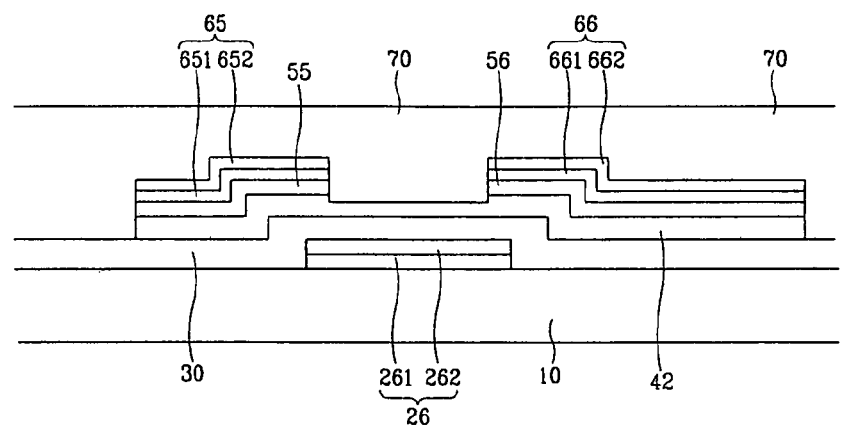

Following the above processes, as shown in FIGS. 22a and 22b, an a—SiCOH film (low dielectric insulating film) is grown by a CVD or PECVD process to form a protection film (70). The protection film (70) is formed by vapor depositing by a CVD or PECVD method by adding a reactant gas mixture of a main source of at least one of the compound of the above Chemical Formulae 1 to 3, the oxidant, gas such as Ar or He, and $SiH_4$. As the main source, at least one of $SiH(CH_3)_3$, $SiO_2(CH_3)_4$, $(SiH)_4O_4(CH_3)_4$, and $(C_2H_5O)$ used, and as the oxidant, $N_2O$ or $O_2$ is used. The low dielectric insulating film has a dielectric constant of 2 to 3.

Figure 23A:
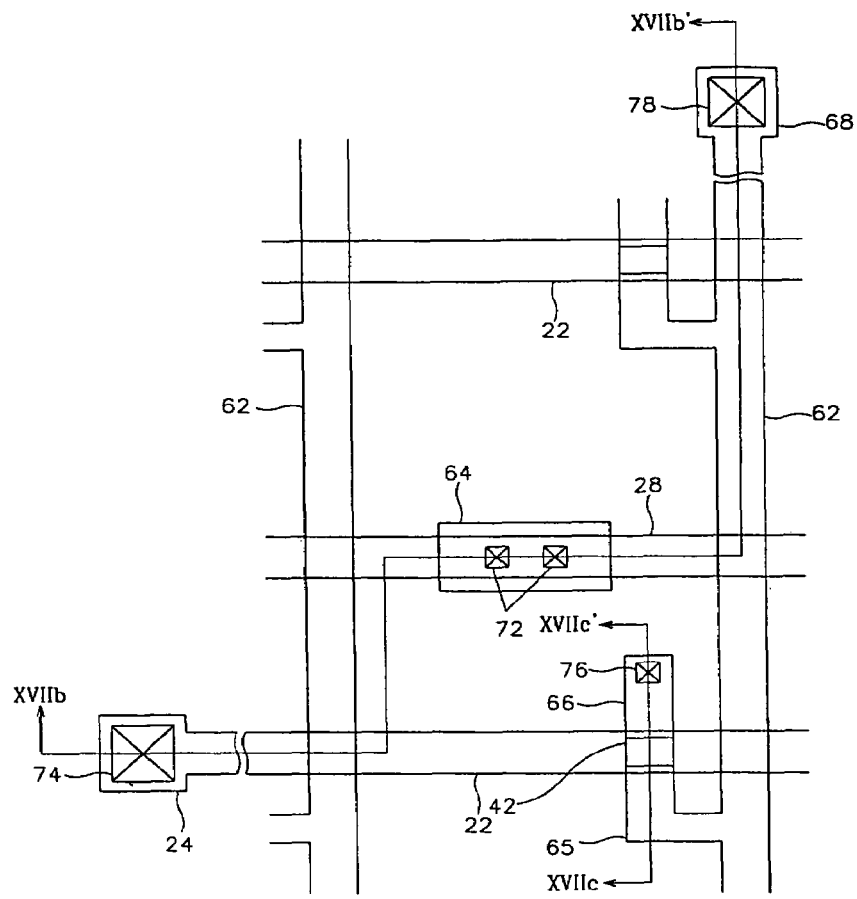
FIG. 23a is an arrangement view of the thin film transistor substrate in a step following those of FIG. 22a and FIG. 22b.
Figure 23B:
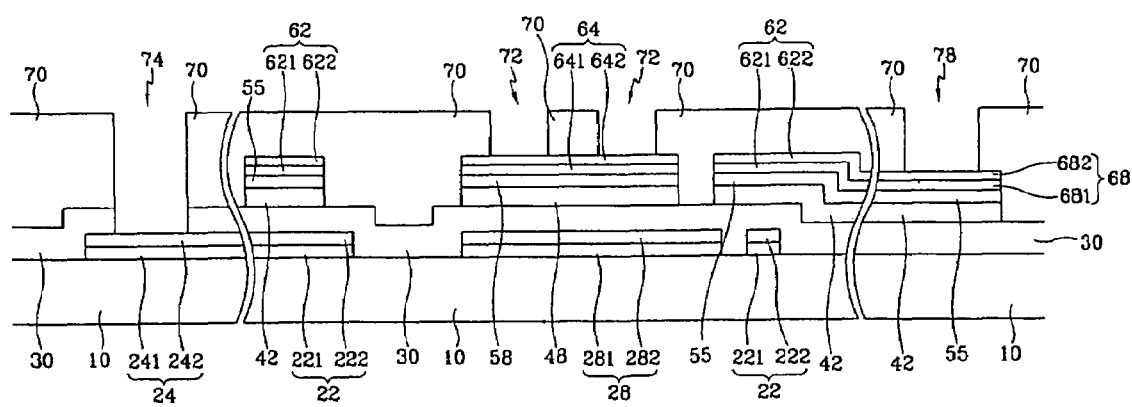
Figure 23C:
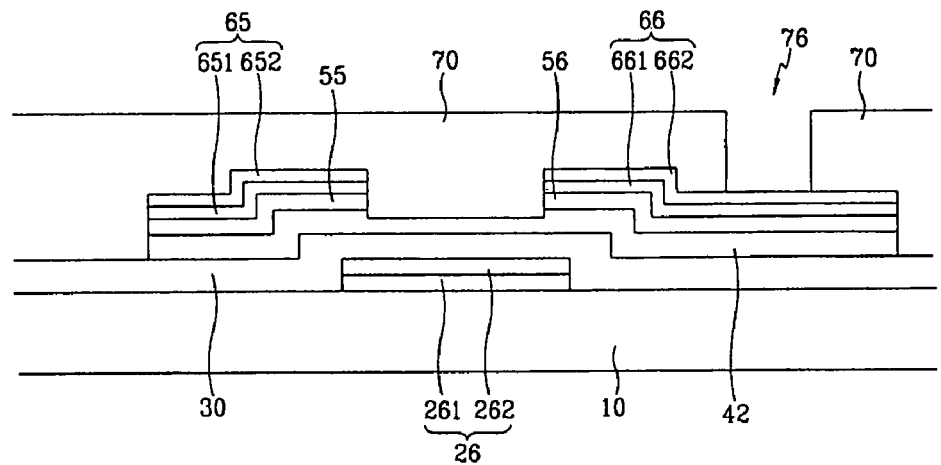

Next, as shown in FIGS. 23a to 23c, the protection film (70) is etched together with the gate insulating film (30) to form contact openings respectively exposing drain electrodes (66), gate pads (24), data pads (68), and maintenance capacitor conductor patterns (64). The area of the contact openings (74, 78) exposing the pads (24, 68) should not exceed 2 mm×60 μg, and is preferably 0.5 mm×15 μm or more.

Finally, as shown in FIGS. 8 to 10, an ITO layer or IZO layer with a thickness of 400 to 500 Å is vapor deposited and photo etched to form pixel electrodes (82) connected with the drain electrodes (65) and the maintenance capacitor conductor patterns (64), supplementary gate pads (86) connected with the gate pads (24), and supplementary data pads (88) connected with the data pads (68).

In the case where the pixel electrodes (82), supplementary gate pads (86), and supplementary data pads (88) are formed of IZO, a chrome etching solution can be used as an etching solution and thus corrosion of data wiring or gate wiring metal exposed through contact openings during the photo-etching process for forming these elements can be prevented. Such a chrome etching solution includes ($HNO_3$/$(NH_4)_2Ce(NO_3)_6$/$H_2O$). Also, in order to minimize contact resistance of contact parts, IZO is preferably stacked at a temperature range between room temperature and 200° C. Further, a target used for forming an IZO thin film preferably includes $In_2O_3$ and ZnO, and the contents of ZnO are preferably 15 to 20 wt %.

In addition, as the gas used in pre-heating process before stacking ITO or IZO, nitrogen is preferable in order to prevent a metal oxidation film from forming on the upper part of the metal films (24, 64, 66, 68) exposed through the contact openings (72, 74, 76, 78).

In Example 11 of the present invention, the manufacturing process is simplified by forming data wiring elements (62, 64, 65, 66, 68), the lower contact layer patterns (55, 56, 58), and the semiconductor patterns (42, 48) using one mask and separating source electrodes and drain electrodes during this process. The advantages according to Example 10 are also obtained.

The low dielectric insulating film of the present invention can be used for a buffer layer for separating a color filter and a thin film transistor in an AOC (array on color filter) structure, in which thin film transistor arrays are formed on color filters.

Figure 24:
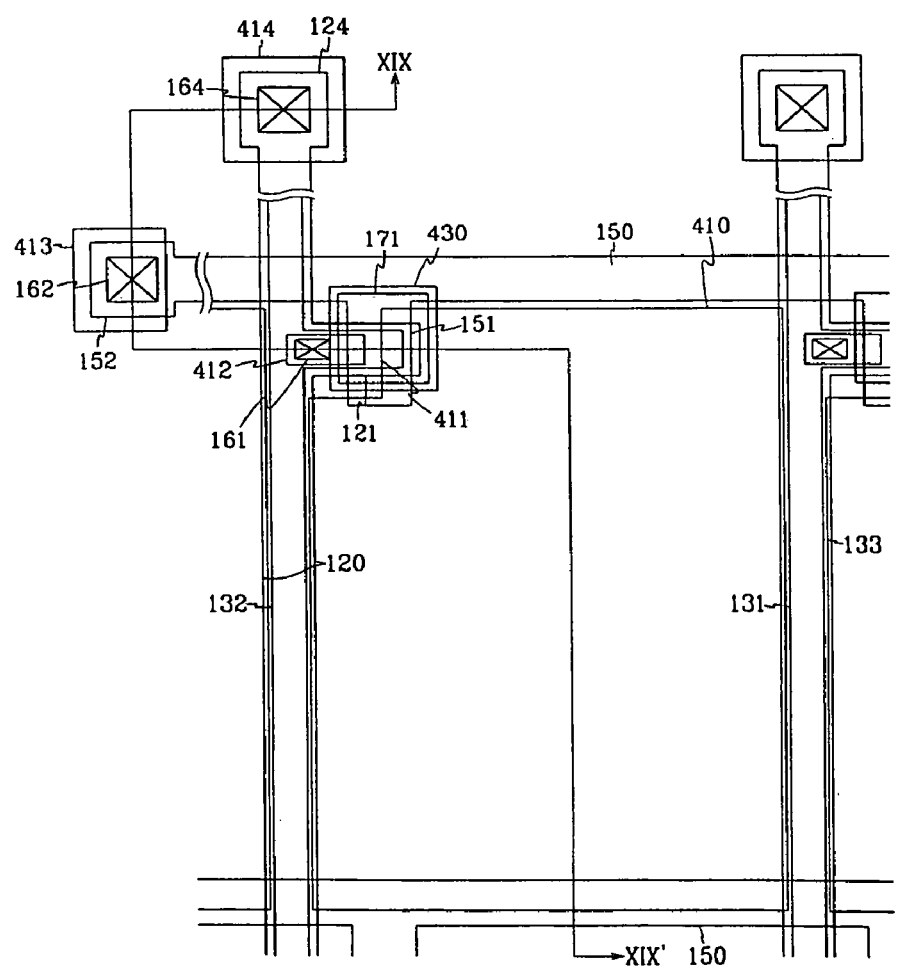
FIG. 24 is an arrangement view of a thin film transistor substrate having a color filter according to Example 12 of the present invention.
Figure 25:
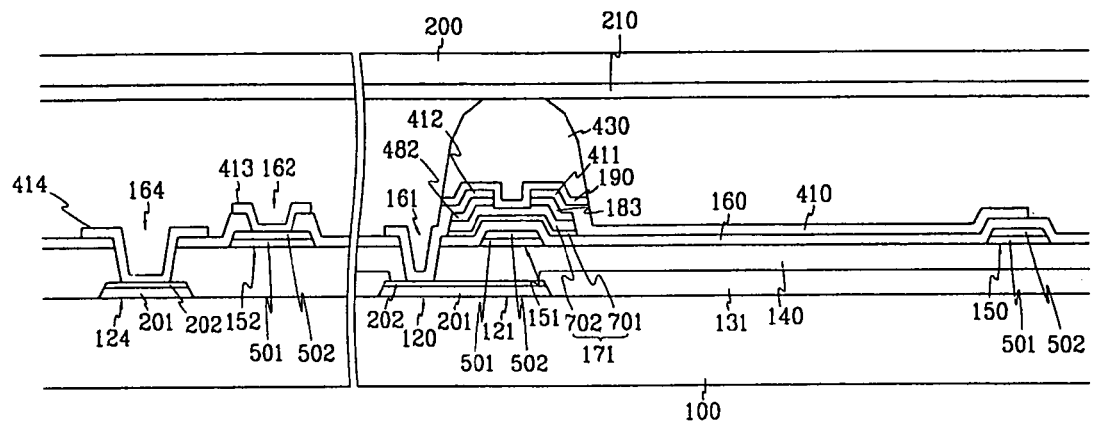
FIG. 25 is a cross sectional view of the thin film transistor substrate shown in FIG. 2 taken along line XIX-XIX'.

FIG. 24 is an arrangement view of the thin film transistor substrate according to Example 12 of the present invention, and FIG. 25 is a cross sectional view of the thin film transistor substrate shown in FIG. 24 taken along line XIX-XIX'. In FIG. 25, the lower substrate, i.e., thin film transistor substrate and the opposing upper substrate are shown together.

Formed on the lower substrate is data wiring comprising lower layers (201) made of one material selected from copper, copper alloy, silver, silver alloy, aluminum, and aluminum alloy; and upper layers (201) made of one material selected from chrome, molybdenum, molybdenum alloy, chrome nitride, and molybdenum nitride.

The data wiring comprises data lines (120) extending vertically, data pads (124) connected to ends of the data line (120) and receiving external pixel signals to transmit the signals to the data lines (120), and light shielding parts (121) that are branched from the data lines (124) and which shield light incident on a semiconductor layer (170) of thin film transistors from the lower part of a substrate (100). The light shielding parts (121) also function as a black matrix for shielding light that is leaked, and can be separated from the data lines (120) and formed as separate wiring.

The data wiring (120, 121,124) is formed of double layers, but it can be formed as a single layer made of a conductive material of copper or its alloy, Al or its alloy, Mo or a Mo-MoW alloy, Cr, Ta, etc.

In consideration of the fact that pixel wiring elements (410, 411, 412) and supplementary pads (413, 414) to be subsequently formed are made of ITO (indium tin oxide), the lower layers (201) of the data wiring (120, 121, 124) is formed of a low resistance material such as aluminum, an aluminum alloy, silver, a silver alloy, Cu, a Cu alloy, etc., and the upper layer (202) is formed of another material, particularly, chrome having good adhesive property with ITO. For example, the lower layers (201) can be formed of Al—Nd, and the upper layers (202) can be formed of CrNx.

In the case where the pixel wiring elements (410, 41.1, 412) and the supplementary pads (413, 414) are made of IZO (indium zinc oxide), the data wiring (120, 121; 124) is preferably formed of a single layer of Al or its alloy, and can be formed of a single layer of copper because copper has superior adhesive properties with IZO and ITO.

On the lower insulating substrate (100), red (R), green (G), and blue (B) color filters (131, 132, 133) of which edges are overlapped with the data wiring elements (120, 121) are formed. The color filters (131, 132, 133) can be formed so as to cover all the data lines (120).

On the data wiring elements (120, 121, 124) and the color filters (131, 132, 133), a buffer layer (140) made of a—Si-COH film (low dielectric insulating film) is formed. The buffer layer (140) blocks outgassing from the color filters (131, 132, 133) and prevents the color filters (131, 132, 133) from being damaged by heat and plasma energy in subsequent processes. Further, since the buffer layer (140) separates the lowermost data wiring elements (120, 121, 124) and thin film transistor array in order to reduce a parasitic capacitance therebetween, ideally the buffer layer (140) is made such that its dielectric constant is as low as possible and its thickness is as great as possible. In this regard, the a—SiCOH film (low dielectric CVD film) is suitable for the buffer layer (140). Specifically, with the use of such material, the dielectric constant of the buffer layer (140) is as low as 2 to 3, its vapor deposition speed is very fast, and its cost is low compared to organic insulating material such as BCB (bisbenzocyclobutene) or PFCB (perfluorocyclobutene). Further, the low dielectric insulating thin film has superior insulating properties over a broad temperature range between room temperature and 400° C.

On the buffer layer (40), there is formed gate wiring of a double layered structure comprising lower layers (501) made of one material selected from copper, a copper alloy, silver, a silver alloy, aluminum, and an aluminum alloy; and upper layers (502) made of one material selected from chrome, molybdenum, a molybdenum alloy, chrome nitride, and molybdenum nitride.

The gate wiring comprises gate lines (150) extending horizontally and intersecting the data lines (120) to define unit pixels, gate pads (152) connected to ends of the gate lines (150) and receiving external scanning signals to transmit the signals to the gate lines (150), and gate electrodes (151) of thin film transistors, the gate electrodes (151) being a part of the gate lines (150).

The gate lines (150) overlap the pixel electrodes (410), which will be described hereinafter, to form a maintenance capacitor for improving a charge maintaining capacity of pixels, and if the maintenance capacity produced by the overlapping of the pixel electrodes (410) and the gate lines (150) is not sufficient, common electrodes for providing a maintenance capacity can be formed.

As explained above, in the case where gate wiring is formed with two or more layers, it is preferable to form one layer with a low resistance material and the other layer with material having good adhesive properties with other material, for example, double layers of Al (or an Al alloy)/Cr or Cu/Cr. In addition, in order to improve adhesive properties, a chrome nitride or molybdenum nitride film, etc. can be added.

The gate wiring elements (150, 151, 152) can be formed of a single layer of a low resistance copper, aluminum, or an aluminum alloy.

On the gate wiring elements (150, 151, 152) and the buffer layer (140), a low temperature vapor deposited gate insulating film (160) is formed. The low temperature vapor deposited gate insulating film (160) can be formed of an organic insulating film, a low temperature amorphous silicon oxide film, a low temperature silicon nitride film, etc. Since in the thin film transistor according to the present invention, color filters are formed on the lower substrate, as the gate insulating film, a low temperature vapor deposited insulating film that can be vapor deposited at a low temperature, for example, a low temperature of 250° C. or less is used instead of common insulating film vapor deposited at a high temperature.

In addition, on the gate electrodes (151) and the gate insulating film (160), semiconductor layers (171) of a double layered structure is formed. In the semiconductor layers (171) of a double layered structure, lower layer semiconductor layers (701) are made of amorphous silicon having a high band gap, and upper semiconductor layers (702) are made of common amorphous silicon having a low band gap compared to the lower semiconductor layers (701). For example, the band gap of the lower semiconductor layers (701) can be 1.9 to 2.1 eV, and that of the upper semiconductor layers (702) can be 1.7 to 1.8 eV. The lower semiconductor layers (701) are formed at a thickness of 50 to 200 Å, and the upper semiconductor layers (702) are formed at a thickness of 1000 to 2000 Å.

Between the upper semiconductor layers (702) and the lower semiconductor layers (701) having different band gaps, a band offset corresponding to the difference between the band gaps of the two layers are formed. When the TFTs are controlled to ON, a channel forms in band offset areas located between the two semiconductor layers (701, 702). The band offset areas have the same atomic structure, and thus have little defects, and good TFT properties can be expected.

The semiconductor layers (171) can be formed of a single layer.

On the semiconductor layers (171), ohmic contact layers (182, 183) including amorphous silicon doped at a high concentration with n-type impurities such as P, microcrystallized silicon, or metal silicide are formed in a separated state.

Formed on the ohmic contact layers (182, 183) are the pixel wiring elements (410, 411, 412) comprising source and drain electrodes (412, 411) formed of ITO and pixel electrodes (410). The source electrodes (412) are connected with the data lines (120) through contact openings (161) formed in the gate insulating film (160) and the buffer layer (140). The drain electrodes (411) are connected with the pixel electrodes (410), and receives pixel signals from thin film transistors to transmit the signals to the pixel electrodes (410). The pixel wiring elements (410, 411, 412) are made of transparent conductive material such as ITO or IZO.

In addition, on the same layer as the pixel wiring elements (410, 411, 412), supplementary gate pads (413) and supplementary data pads (414) respectively connected with the gate pads (152) and the data pads (124) through contact openings (162, 164) are formed. The supplementary gate pads (413) are in direct contact with upper layers (502) of the gate pads (152), and the supplementary data pads (414) are in direct contact with upper layers (202) of the data pads (124), the upper layers (502) and (202) being made of chrome films. In the case where the gate pads (152) and the data pads (124) comprise chrome nitride films or molybdenum nitride films, the supplementary gate pads (413) and the supplementary data pads (414) are preferably in contact with the chrome nitride film or molybdenum nitride film. These films complement adhesive properties between the pads (152, 154) and an external circuit apparatus, and also protect the gate and data pads (152, 154). However, the application thereof is optional. Although the pixel electrodes (410) are shown overlapping neighboring gate lines (150) and data lines (120) to increase the aperture ratio, it is possible that such overlapping need not occur.

The ohmic contact layers (182, 183) function to reduce a contact resistance between the source and drain electrodes (412, 411) and the semiconductor layers (171), and may comprise metal silicide such as molybdenum, nickel, chrome, or a micro-crystallized silicon layer, and may leave a remaining silicide metal film.

On the source and drain electrodes (412, 411), protection films (190) for protecting thin film transistors are formed, and on the protection films (190), photosensitive organic films (430) having a deep color and superior photo absorption properties are formed. The colored organic films (430) shields light incident on the semiconductor layers (171) of thin film transistors, and the height of the colored organic films (430) is controlled for use as spacers for maintaining a gap between the lower insulating substrate (100) and the opposite upper insulating substrate (200). The protection films (190) and the organic films (430) may be formed along the gate lines (150) and the data lines (120), and the organic films (430) may shield light leaking in the peripheries of the gate wiring and data wiring.

In the case where the organic films (430) are designed so as to cover all the gaps between pixel electrodes and each metal layer as in the thin film transistor substrate of Example 13 mentioned hereinafter, there is no need to install a separate black matrix for shielding light on the upper substrate (200).

On the upper substrate (200), a common electrode (210) made of ITO or IZO and producing an electrical field together with the pixel electrode (410) is formed over an entire inside surface of the upper substrate (200).

Referring now to FIGS. 26a to 33b and FIGS. 24 and 25, a process for manufacturing a thin film transistor substrate according to the Example of the present invention will be explained.

Figure 26A:
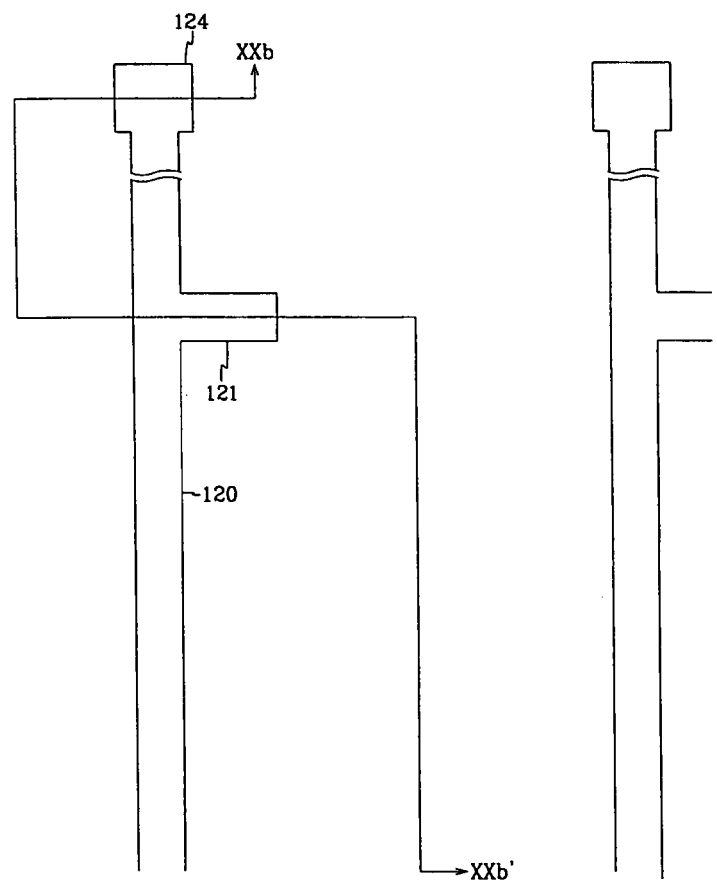
FIG. 26a is an arrangement view of the thin film transistor substrate according to Example 12 of the present invention in the first manufacturing step.
Figure 26B:
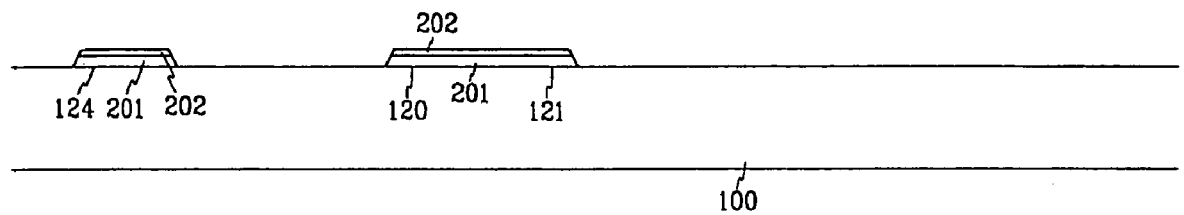

As shown in FIGS. 26a and 26b, on a lower insulating substrate (100), a low resistance conductive material such as aluminum, an aluminum alloy, copper, or a copper alloy and conductive material having superior adhesive properties with ITO such as chrome, molybdenum or titanium, or chrome nitride or molybdenum nitride are sequentially vapor deposited by sputtering, etc. Dry or wet-etching is then performed by a photo etching process using a mask to form data wiring (120, 121, 124) with a double layered structure of upper layers (202) and lower layers (201) comprising data lines (120), data pads (124), and light shielding parts (121) on the lower insulating substrate (100).

As explained above, in consideration of the fact that pixel wiring elements (410, 411, 412) and supplementary pads (413, 414), which are formed hereinafter, are made of ITO, the data wiring is formed comprised of the lower layers (201) of aluminum, an aluminum alloy, Cu, or a Cu alloy and the upper layers (202) of chrome, molybdenum, or titanium. However, in the case where the pixel wiring elements (410, 411, 412) and the supplementary pads (413, 414) are made of IZO, the data wiring may be formed of a single layer of aluminum or an aluminum alloy, and the manufacturing process may be simplified by forming the data wiring of a single layer of Cu or a Cu alloy.

Figure 27A:
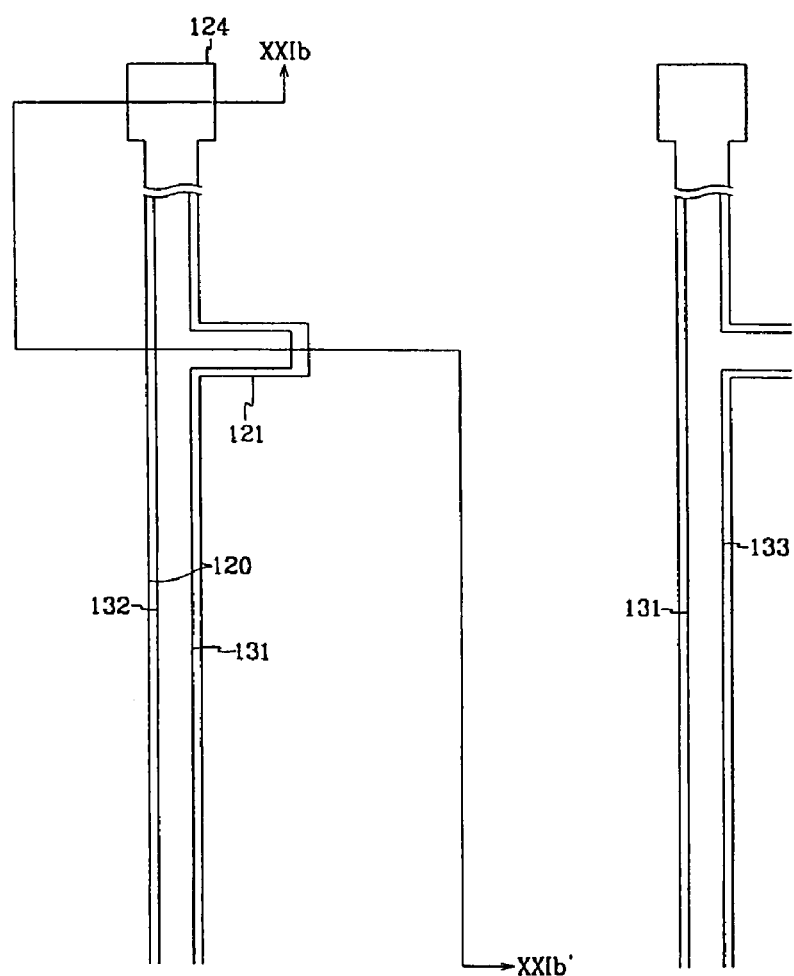
Figure 27B:
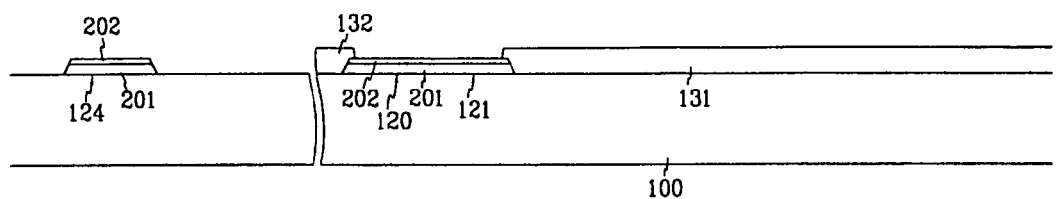

Next, as shown in FIGS. 27a and 27b, photosensitive material including red (R), green (G), and blue (B) pigments are sequentially coated and patterned by a photo process using a mask to form red (R), green (G), and blue (B) color filters (131,132, 133). Although the red, green, and blue color filters (131, 132, 133) are formed using three sheets of masks, in order to reduce manufacturing costs, they can be formed while moving a single sheet of mask. Further, the red, green, and blue color filters (131, 132, 133) can be formed without a mask using a laser transcription method or a print method, thus minimizing manufacturing costs. As shown in the drawings, the edges of the red, green, blue color filters (131, 132, 133) are preferably formed so as to overlap the data lines (120).

Figure 28A:
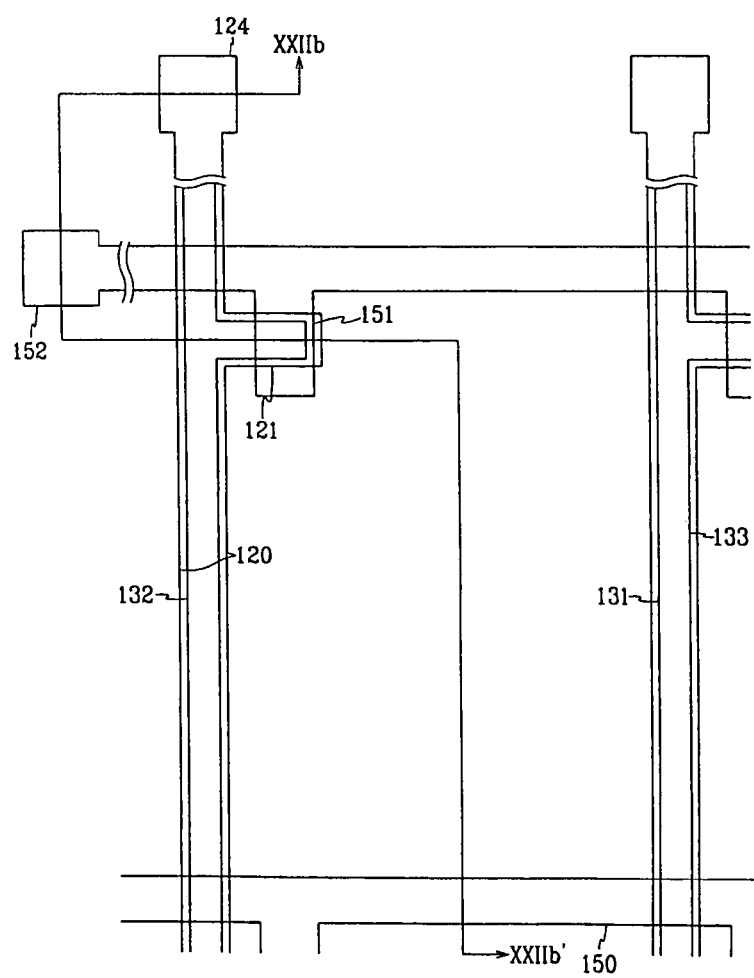
Figure 28B:
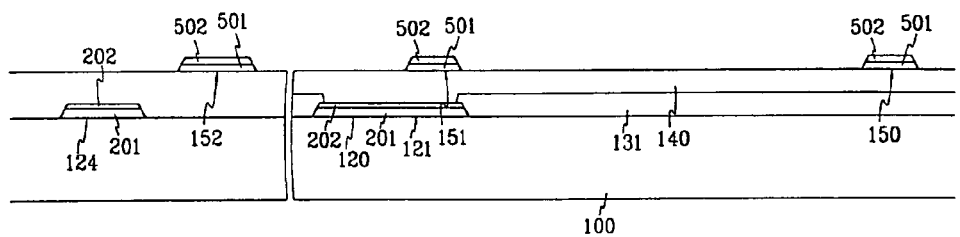

Next, as shown in FIGS. 28a and 28b, on the insulating substrate (100), an a—SiCOH film (low dielectric insulating film) is grown by a vapor deposition method to form a buffer layer (140).

Subsequently, physically and chemically stable material such as chrome, molybdenum, titanium, chrome nitride, or molybdenum nitride and low resistance conductive material such as aluminum, an aluminum alloy. copper, or a copper alloy are sequentially vapor deposited, and patterned by a photo etching process using a mask to form gate wiring (150, 151, 152) on the buffer layer (140), the gate wiring comprising gate lines (150), gate electrodes (151), and gate pads (152).

The gate wiring elements (150, 151, 152) may be formed in single layer structure.

Figure 29:
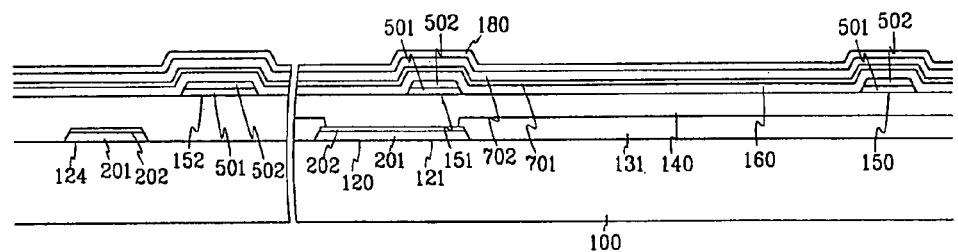
FIG. 29 is a cross sectional view of the substrate in a step following that of FIG. 28b.

Following the above process, as shown in FIG. 29, on the gate wiring elements (150, 151, 152) and the organic insulating film (140), a low temperature vapor deposited gate insulating film (160), a first amorphous silicon film (701), a second amorphous silicon film (702), and an amorphous silicon film (180) doped with impurities are sequentially vapor deposited.

The low temperature vapor deposited gate insulating film (160) can be formed using an organic insulating film, a low temperature amorphous silicon oxide film, low temperature amorphous silicon nitride, etc. that can be vapor deposited at a temperature of 250° C. or less.

The first amorphous silicon film (701) is formed of an amorphous silicon film having a high band gap of, for example, 1.9 to 2.1 eV, and the second amorphous silicon film (702) is formed of a common amorphous silicon film having a lower band gap than the first amorphous silicon-film (701) of, for example, 1.7 to 1.8 eV. The first amorphous silicon film (701) can be vapor deposited by a CVD method by adding an appropriate amount of $CH_4$, $C_2H_2$ or $C_2H_6$ to $SiH_4$, which is raw material gas for amorphous silicon film. For example, if $SiH_4$ and $CH_4$ are introduced into CVD equipment at a ratio of 1:9 and a vapor deposition process is progressed, an amorphous silicon film having a band gap of 2.0 to 2.3 eV and containing approximately 50% of C can be vapor deposited. The band gap of the amorphous silicon layer is influenced by vapor deposition process conditions, and the band gap can be easily controlled within a range of 1.7 to 2.5 eV depending on the amount of carbon compounds added.

The low temperature vapor deposited gate insulating film (160), the first amorphous silicon film (701), the second amorphous silicon film (702), and the impurities-doped amorphous silicon film (180) can be sequentially vapor deposited in the same CVD equipment without disruption to the vacuum state.

Figure 30A:
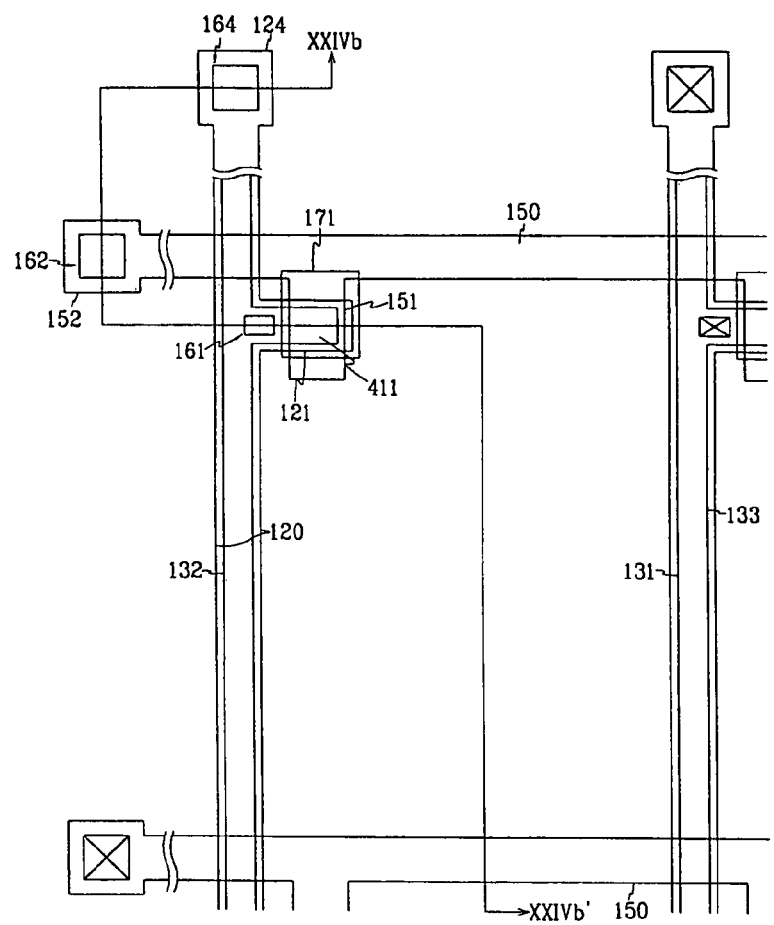
FIG. 30a is an arrangement view of the substrate in a step following that of FIG. 29.
Figure 30B:
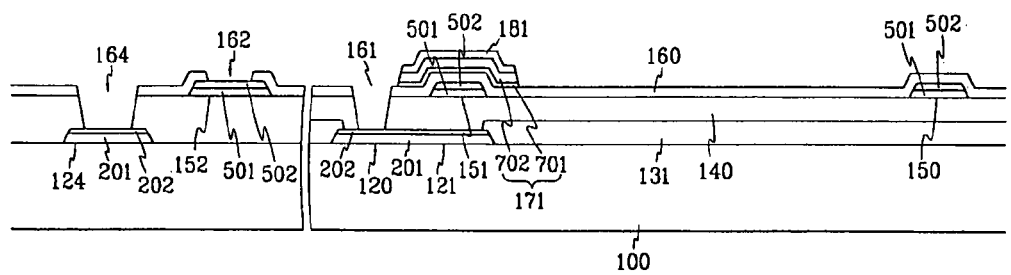

Next, as shown in FIGS. 30a and 30b, the first amorphous silicon film (701), the second amorphous silicon film (702), and the impurities-doped amorphous silicon film (180) are patterned by a photo etching process using a mask to form protruding semiconductor layers (171) and ohmic contact layers (181), and simultaneously, to form contact openings (161, 162, 164) respectively exposing the data lines (120), the gate pads (152), and the data pads (124) on the low temperature vapor deposited gate insulating film (160) and the organic insulating film (140).

Except for areas over the gate electrodes (151), it is necessary that the first and second amorphous silicon films (701, 702) and the impurities-doped amorphous silicon film (180) be completely removed; on the gate pads (152), the gate insulating film (160) should also be removed together with the first and second amorphous silicon films (701, 702) and the impurities-doped amorphous silicon film (180); and on the data lines (120) and the data pads (124), the organic insulating film (140) should also be removed together with the first and second amorphous silicon films (701, 702), the impurities-doped amorphous silicon film (180), and the low temperature vapor deposited gate insulating film (160).

In order to form these elements by a photo etching process using one mask, a photosensitive film pattern having different thicknesses in different areas should be used as an etching mask. This will be explained with reference to FIGS. 31 and 32.

Figure 31:
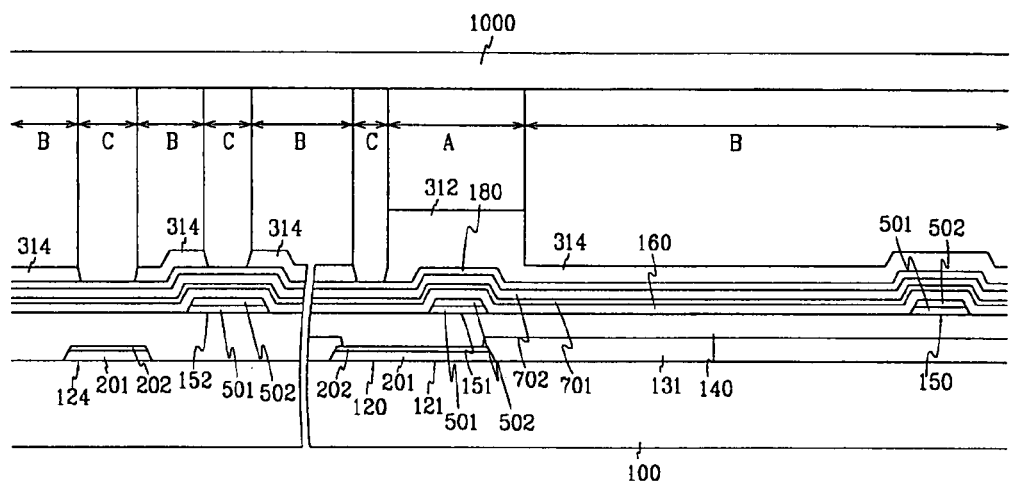
FIGS. 31 and 32 show cross sections of manufacturing processes conducted between FIG. 29 and FIG. 30b.

First, as shown in FIG. 31, on the impurities-doped amorphous silicon film (180), a photosensitive film is coated at a thickness of 1 to 2 μm, and then the photosensitive film is irradiated through photo etching process using a mask and developed to form first and second photosensitive film patterns (312, 314).

Among the photosensitive film patterns (312, 314), first photosensitive film patterns (312) located on the gate electrodes (151) are formed thicker than the second photosensitive film patterns (314). The photosensitive film is completely removed at areas of the data lines (120), the data pads (124), and the gate pads (152). The thickness of the second photosensitive film patterns (314) is preferably ½ or less the thickness of the first photosensitive film patterns (312), for example, 4000 Å or less.

As explained above, in order to change the thickness of the photosensitive film according to its location, various methods can be used. Use of a positive photosensitive film will be explained herein.

A pattern smaller than a resolution of exposure equipment, for example a slit or lattice-shaped pattern is formed or a translucent film is formed on areas B, and thus if light is irradiated onto a photosensitive film through a mask (1000) capable of controlling the amount of irradiation, the degree of decomposition of polymers differs according to the amount or strength of the irradiated light. If light exposure is stopped when the polymers in areas C, which are completely exposed to light, are completely decomposed, since the amount of irradiated light passing through areas B where the slits or translucent film is formed is small compared to the part completely exposed to light, only parts of the photosensitive film at areas B are decomposed while the remaining parts are not decomposed. If the light exposure time is too long, all the molecules will be decompose. An excessive exposure time should therefore be avoided.

If the photosensitive film is developed, the first photosensitive film patterns (312) where molecules are not decomposed remains intact, the second photosensitive film patterns (314) onto which light is minimally irradiated remains thinner than the first photosensitive film patterns (312), and at locations corresponding to areas C completely exposed to light, the photosensitive film is almost completely removed.

By the above-mentioned method, a photosensitive film pattern having different thicknesses according to its location is formed.

Figure 32:
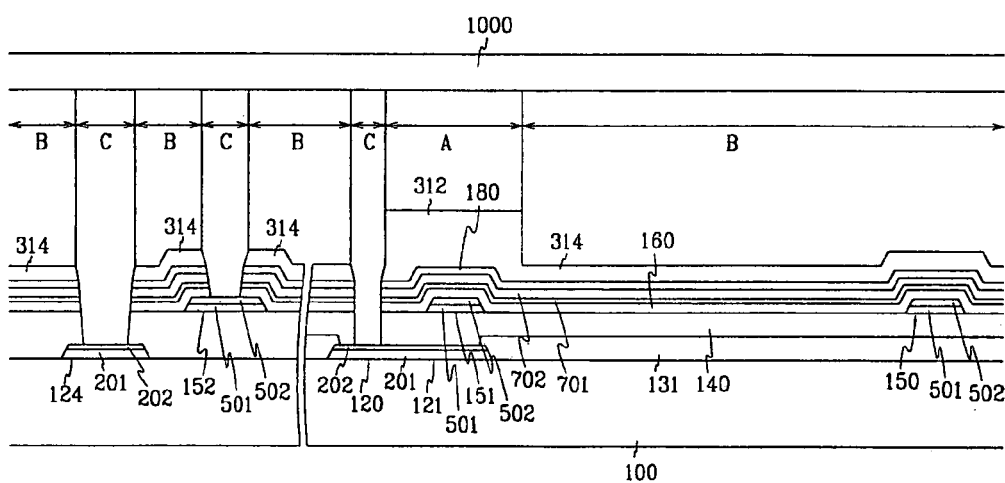

Subsequently, as shown in FIG. 32, the impurity-doped amorphous silicon film (180), the second amorphous silicon film (702), the first amorphous silicon film (701), and the low temperature vapor deposited gate insulating film (160) are dry-etched using the photosensitive film patterns (312, 314) as an etching mask to thereby complete the contact openings (162) that expose the gate pads (152) such that the buffer layer (140) in areas C are exposed. Next, the buffer layer (140) in areas C is dry-etched using the photosensitive film patterns (312, 314) as an etching mask to complete the contact openings (161, 164) that expose the data lines (120) and the data pads (124).

Next, the second photosensitive film patterns (314) are completely removed. To completely remove remnants of the second photosensitive film patterns (314), an ashing process using oxygen may be additionally performed.

Thus, the second photosensitive film patterns (314) are removed, the impurity-doped amorphous silicon film (180) is exposed, and the first photosensitive film patterns (312) is decreased by an amount equal to the thickness of the second photosensitive film patterns (314).

Following the above, the impurity-doped amorphous silicon film (180) and the lower first and second amorphous silicon films (701, 702) are etched to remove the same using the first photosensitive film patterns (312) as an etching mask, thereby resulting in the semiconductor layers (171) and the ohmic contact layers (181) on the low temperature vapor deposited gate insulating film (160) on the gate electrodes (151).

Finally, the remaining first photosensitive film patterns (312) is removed. To completely remove the remnants of the first photosensitive film patterns (312), an ashing process using oxygen can additionally performed.

Figure 33A:
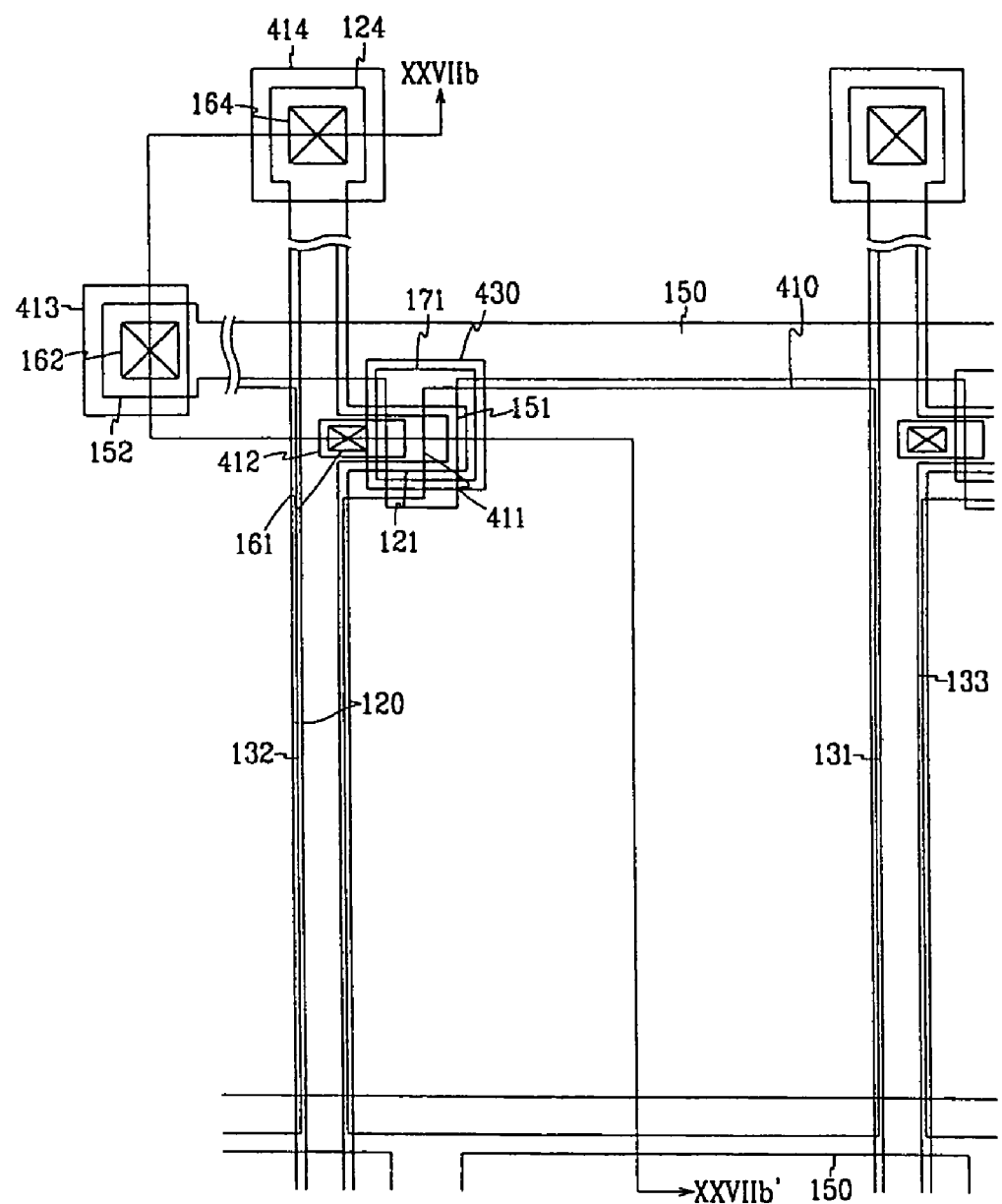
Figure 33B:
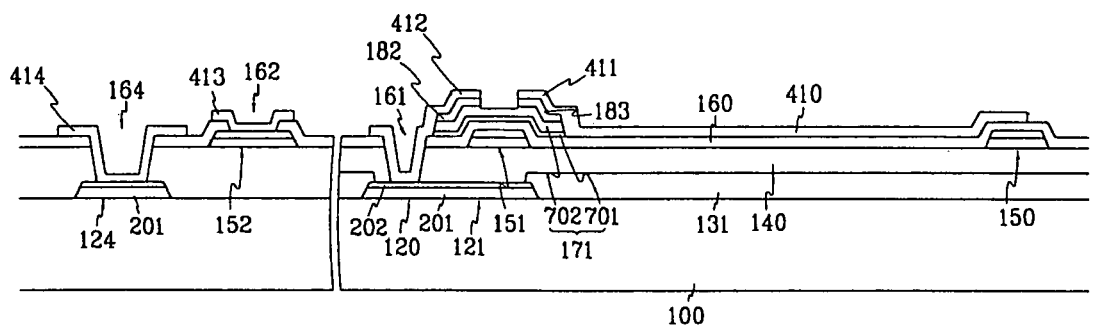

Next, as shown in FIGS. 33a and 33b, an ITO layer is vapor deposited and patterned by a photo etching process using a mask to form pixel electrodes (410), source electrodes (412), drain electrodes (411), supplementary gate pads (413) and supplementary data pads (414). IZO can be used instead of ITO.

Using the source electrodes (412) and drain electrodes (411) as an etching mask, the ohmic contact layers (181) therebetween are etched to form an ohmic contact layer pattern separated into two parts (182, 183), thereby exposing the semiconductor layers (171) between the source electrodes (412) and the drain electrodes (411).

Figure 34:
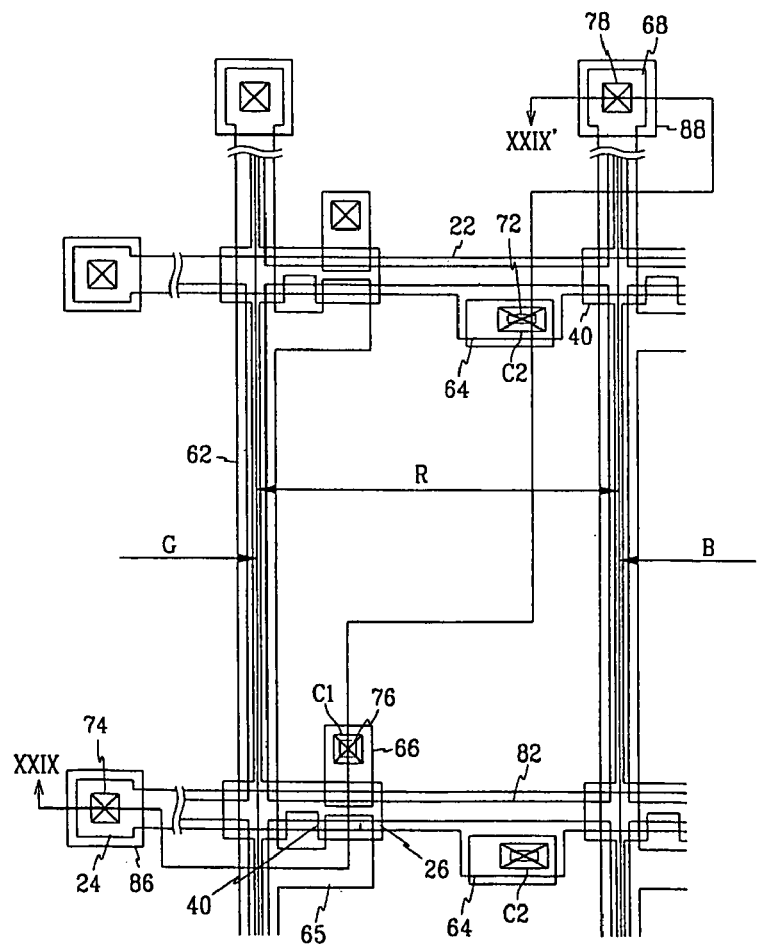
FIG. 34 is an arrangement view of a thin film transistor substrate for a liquid crystal display according to Example 13 of the present invention.
Figure 35:
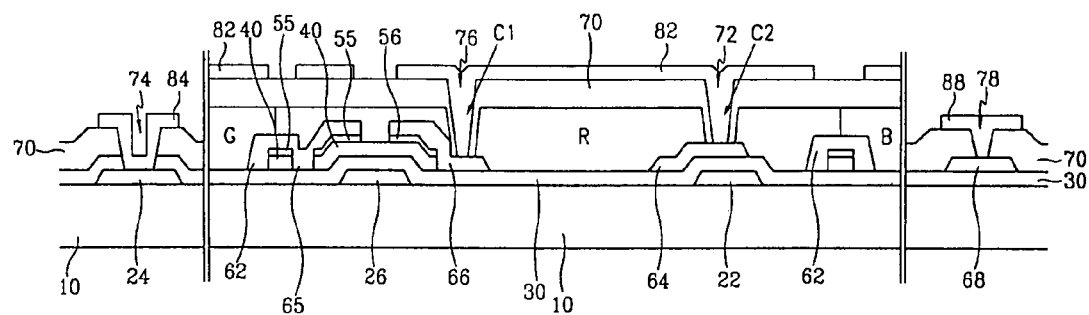
FIG. 35 is a cross sectional view of the thin film transistor substrate of FIG. 34 taken along line XXIX-XXIX'.

Finally, as shown in FIGS. 34 and 35, on the lower insulating substrate (100), insulating material such as silicon nitride or silicon oxide and insulating material such as photosensitive organic material comprising black pigments are sequentially stacked and light-exposed and developed by a photo process using a mask to form a colored organic film (430), which is used as an etching mask to etch the lower insulating material to form a protection film (190). The colored organic film (430) shields light incident on a thin film transistor, and can be formed on the gate wiring or data wiring to shield light coming from peripheries of the wiring. Further, as in the Examples of the present invention, the height of the organic film (430) is controlled for use as a material to maintain a gap.

In addition, on the upper insulating substrate (200), a transparent conductive material of ITO or IZO is stacked to form a common electrode (210).

In the case where the colored organic film (430) is designed so as to cover all the gaps between pixel electrodes (410) and each metal layer, a separate black matrix for light shielding need not to be formed on the upper substrate.

In the case where the gate lines (150) and the pixel electrodes (410) are designed so as to have a predetermined space therebetween, it is necessary to cover areas through which light passes therebetween. To realize this, portions of the data lines (120) formed under the color filters (131., 132, 133) are extended so as to extrude in a direction of the gate lines (150) to cover gaps between the gate lines (150) and the pixel electrodes (410). In areas that cannot be covered with the data lines (120), specifically, areas between two neighboring data lines (120), a colored organic film (430) can be formed so as to cover the gaps.

Although not shown in the drawings, on the same layer as the gate wiring elements (150, 151, 152), vertical parts of a black matrix for shielding light leaking through edges of a picture display part is formed of material for forming the gate wiring elements (150, 151, 152). Also, on the same layer as the data wiring elements (120, 121, 124), horizontal parts of black matrix for shielding light leaking through the edges of the picture display part is formed of metal material for forming the data wiring elements (120, 121, 124).

As a result, in the case where horizontal parts and vertical parts of a black matrix for shielding light leaking through the edges of the picture display part are formed of material for forming the gate wiring elements (150, 151, 152) and the data wiring elements (120, 121, 124), areas of light leakage between the gate lines (150) and pixel electrodes (410) are covered with the data wiring elements (120, 121, 124), and areas of light leakage between two neighboring gate lines (150) are covered with the colored organic film (430), the data wiring, gate wiring, and gap maintaining material can cover all the areas through which light leaks in a thin film transistor substrate, thereby making unnecessary the formation of a separate black matrix on the upper substrate (200). Therefore, the aperture ratio can be improved because since arrangement errors between the upper substrate (200) and the lower substrate (100) are no longer a factor. Further, between the data lines (120) and the pixel electrodes (410), the gate insulating film (160) and the buffer layer (140), which has a low dielectric constant, are formed to minimize a parasitic capacitance produced therebetween, and thus display device characteristics can be improved and a maximization of the aperture ratio is ensured because there is no need to space the data lines (120) and the pixel electrodes (410).

Therefore, according to the Examples of the present invention, to stably realize a thin film transistor substrate for forming a thin film transistor on a color filter, TFTs are manufactured under low temperature process conditions. Specifically, in order to prevent damage to the color filters due to high temperature processes, a gate insulating film is formed of a low temperature vapor deposited insulating film, and in order to prevent channel property deterioration caused by contact with the low temperature vapor deposited gate insulating film, a channel is formed on a bulk of a semiconductor layer instead of on the interface of the low temperature vapor deposited insulating film and the semiconductor layer.

The low dielectric CVD film according to the present invention can be used for a protection film formed between color filters and pixel electrodes in a COA (color filter on array) structure. This will be explained in detail with reference to the drawings.

First, referring to FIGS. 34 to 35, the structure of a thin film transistor substrate for a liquid crystal display according to Example 10 of the present invention will be explained in detail.

FIG. 34 is an arrangement view of thin film transistor substrate for liquid crystal display according to Example 13 of the present invention, and FIG. 35 is a cross sectional view of the thin film transistor substrate shown in FIG. 34 taken along line XXIX-XXIX'.

First, on an insulating substrate (10), gate wiring made of a conductor or metal such as Al, an Al alloy, Mo, a MoW alloy, Cr, or Ta is formed. The gate wiring comprises scanning signal lines or gate lines (22) extending horizontally, gate pads (24) connected to ends of the gate lines (22) and receiving external scanning signals to transmit the same to the gate lines (22), and gate electrodes (26) of thin film transistors that are part of the gate lines (22). Extruded parts of the gate lines (22) overlap maintenance capacity conductor patterns (64) connected with pixel electrodes (82) (to be described below) to form maintenance capacitors for improving charge maintaining capacities of the pixels (82).

Although the gate wiring elements (22, 24, 26) can be formed of a single layer, double layers, or triple layers. In the case where the gate wiring elements (22, 24, 26) are formed of two or more layers, it is preferable to form one layer(s) with a low resistance material and the other layer(s) with material having good adhesive properties with other materials, for example, double layers of Cr/Al (or Al alloy) or Al/Mo. In the Examples of the present invention, the gate wiring elements (22, 24, 26) are comprised of a lower film made of chrome and an upper film made of aluminum-neodymium.

On the gate wiring elements (22, 24, 26) and the substrate (10), a gate insulating film (30) made of silicon nitride (SiN,) is formed, and the gate electrodes (24) are covered with the gate insulating film (30).

On the gate insulating film (30), semiconductor patterns (40) made of semiconductor such as hydrogenated amorphous silicon are formed, and on the semiconductor patterns (40), ohmic contact layers (55, 56) made of amorphous silicon doped with n-type impurities such as P with high concentration are formed.

Formed on the ohmic contact layers (55, 56) are source electrodes (65) and drain electrodes (66) of thin film transistors that are a part of data wiring and made of conductive material such as Mo, a MoW alloy, Cr, Al, an Al alloy, or Ta. The data wiring is formed vertically, and comprises data lines (62) connected with the source electrodes (65), data pads (68) connected to one end of the data lines (62) to receive external picture signals, and maintenance capacitor conductor patterns (64) overlapping the extruded parts of the gate lines (22).

Although the data wiring elements (62, 64, 65, 66, 68) can be formed of a single layer, double layers, or triple layers, similarly to the gate wiring elements (22, 24, 26). In the case where the data wiring elements (62, 64, 65, 66, 68) are formed of two or more layers, it is preferable to form one layer(s) with a low resistance material and the other layer(s) with material having good adhesive properties with other materials.

The ohmic contact layers (55, 56) reduce a contact resistance between the semiconductor patterns (40), which are provided under the ohmic contact layers (55, 56), and the data wiring elements (62, 64, 65, 66, 68), which are provided above the ohmic contact layers (55, 56).

Although not shown in the drawings, on the data wiring elements (62, 64, 65, 66, 68) and the semiconductor patterns (40) not covered therewith, an interlayer insulating film made of an insulating material such as silicon nitride or silicon oxide can be formed.

Formed vertically in the pixel areas of the gate insulating film (30) are red, green, and blue color filters (R, G, B) having openings (C1, C2) exposing the drain electrodes (65) and the maintenance capacitor conductor patterns (64). The boundaries of the red, green, blue color filters are shown to coincide on the data line (62), but they can overlap each other on the data line (62) to shield light leaking between pixel areas, and they are not formed on pad parts where the gate and data pads (24, 68) are formed.

On the red, green, blue color filters (81, 82, 83), a protection film (70) made of an a—SiCOH film (low dielectric insulating film) vapor deposited by the above method is formed. The protection film (70) has contact openings (74, 78, 76, 72) exposing, in addition to the gate insulating film (30), the gate pads (24), the data pads (68), the drain electrodes (66), and the maintenance capacitor conductor patterns (64). The contact openings (76, 72) exposing the drain electrodes (66) and the maintenance capacitor conductor patterns. (64) are located inside the openings (C1, C2) of the color filters (R, G, B), and as above-mentioned, in the case where an interlayer insulating film is added under the color filters (R, G, B), they have the same pattern as the interlayer insulating film.

On the protection film (70), there are formed the pixel electrodes (82) receiving picture image signals from thin film transistors to produce an electrical field together with an electrode of an upper substrate. The pixel electrodes (82) are made of transparent conductive material such as ITO (indium tin oxide) or IZO (indium zinc oxide), and are physically and electrically connected with the drain electrode (66) through the contact openings (76) to receive picture image signals. The pixel electrodes (82) overlap the gate lines (22) and the data lines (62) to increase an aperture ratio. However, it is possible that pixel electrodes (82) not overlap the gate lines (22) and the data lines (62). Further, the pixel electrodes (82) are also connected with the maintenance capacitor conductor patterns (64) through the contact openings (72) to transmit picture image signals to the conductor patterns (64). In addition, on the gate pads (24) and the data pads (68), supplementary gate pads (84) and supplementary data pads (88) respectively connected therewith through the contact openings (74, 78) are formed. The supplementary gate pads (84, 88) complement adhesive properties between the pads (24, 68) and an external circuit apparatus, and also protect the pads (24, 28). However, the application thereof is optional.

Now, referring to FIGS. 36a to 40b and FIGS. 34 and 35, a process for manufacturing a thin film transistor array substrate for a liquid display according to Example 10 of the present invention will be explained in detail.

Figure 36A:
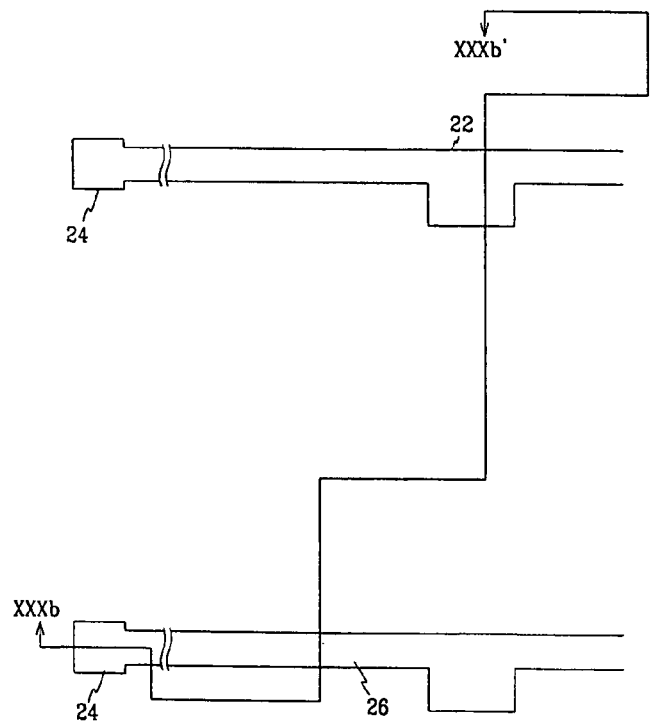
FIG. 36a is an arrangement view of the thin film transistor substrate of Example 13 of the present invention in a first manufacturing step.
Figure 36B:
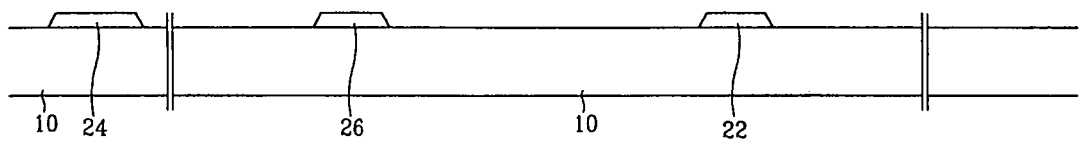

As shown in FIGS. 36a and 36b, a conductor layer such as metal is stacked by sputtering, etc., and dry or wet-etched by a first photo etching process to form gate wiring comprising gate lines (22), gate pads (24), and gate electrodes (26).

Figure 37A:
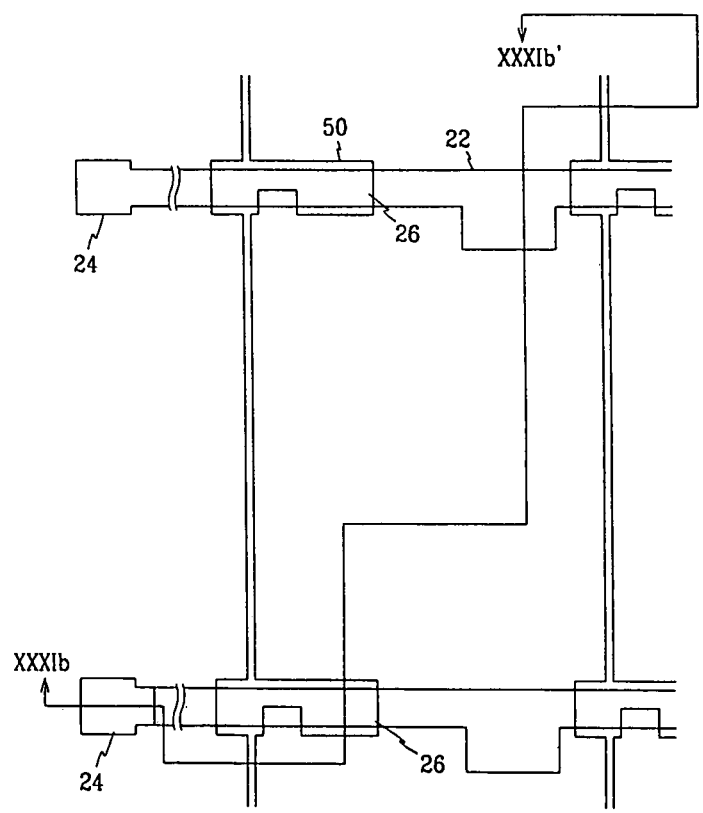
FIG. 37a is an arrangement view of the thin film transistor substrate of Example 13 of the present invention in a second manufacturing step.
Figure 37B:
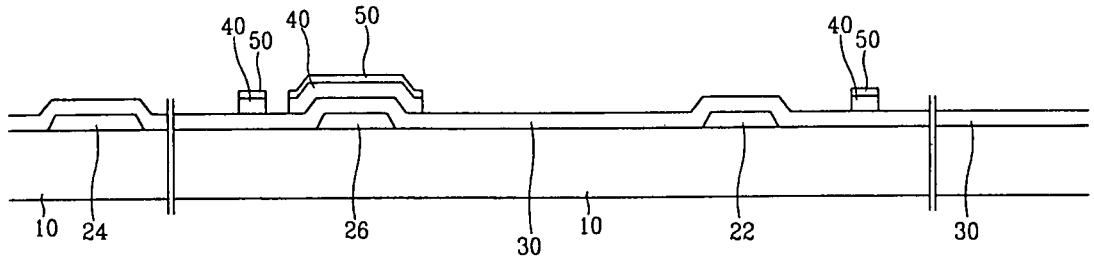

Next, as shown in FIGS. 37a and 37b, a gate insulating film (30), semiconductor such as hydrogenated amorphous silicon, and amorphous silicon doped with n-type impurities such as P are sequentially stacked at a thickness of respectively 1,500 to 5,000 Å, 500 to 2,000 Å, and 300 to 600 Å by a chemical gas phase vapor deposition method, and patterned by a photo etching process using a mask to sequentially pattern an amorphous silicon layer and a doped amorphous silicon layer, thereby forming semiconductor patterns (40) and ohmic contact layers (50).

Figure 38A:
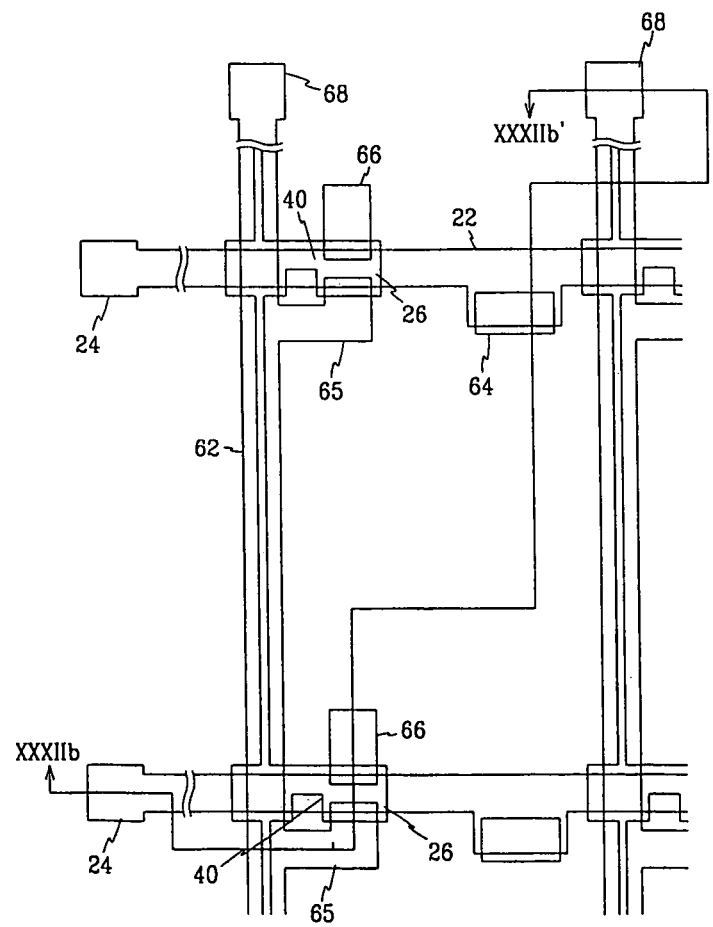
FIG. 38a is an arrangement view of the thin film transistor substrate of Example 13 of the present invention in a third manufacturing step.
Figure 38B:
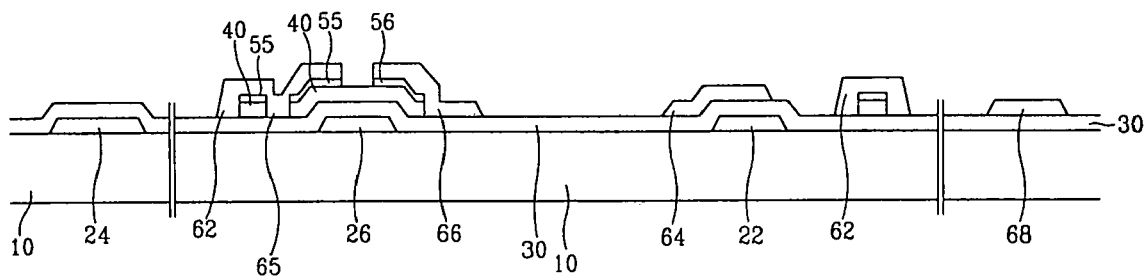

Subsequently, as shown in FIGS. 38a and 38b, a conductor layer such as metal is vapor deposited at a thickness of 1,500 to 3,000 Å by sputtering, etc., and patterned by a photo etching process using a mask to form data wiring comprising data lines (62), source electrodes (65), drain electrodes (66), data pads (68), and maintenance capacitor conductor patterns (64). The ohmic contact layers (50) not covered with the source electrodes (65) and the drain electrodes (66) are etched to expose the semiconductor layers (40) between the source electrodes (65) and the drain electrodes (66) and to separate the ohmic contact layers (55, 56) into two parts. Silicon nitride or silicon oxide can be stacked to form an interlayer insulating film (not shown).

Figure 39A:
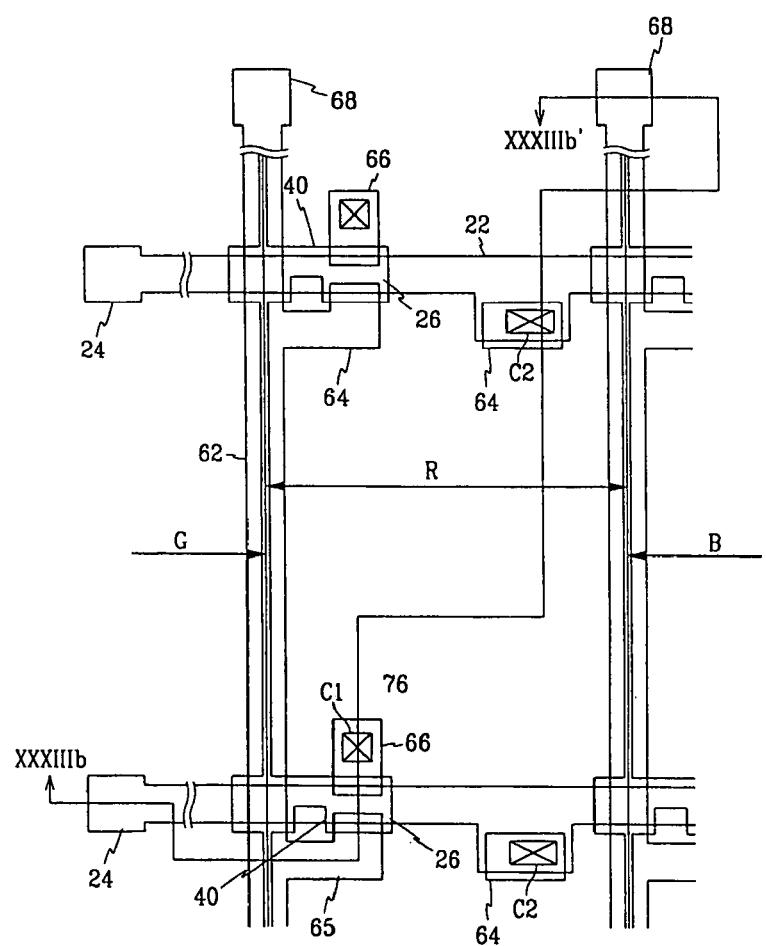
FIG. 39a is an arrangement view of the thin film transistor substrate of Example 13 of the present invention in a fourth manufacturing step.
Figure 39B:
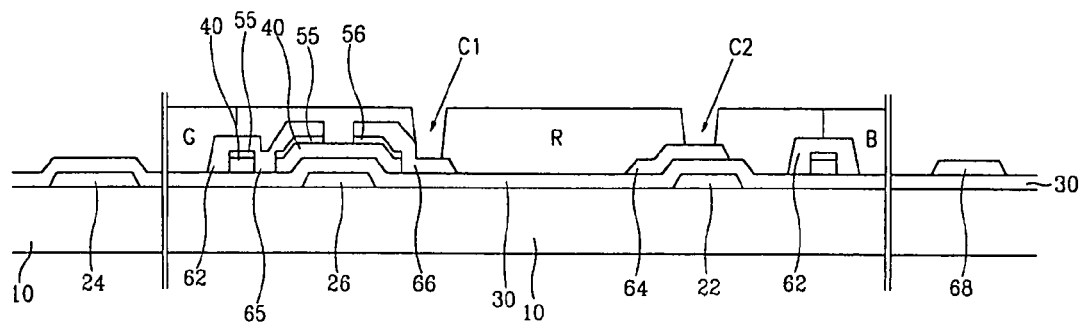

After forming the data wiring elements (62, 64, 65, 66, 68) and the interlayer insulating film (not shown), as shown in FIGS. 39a to 39b, photosensitive organic material comprising red, green, and blue pigments is sequentially coated to sequentially form red, green, and blue color filters (R, G, B) through a photo process. When forming the red, green, and blue color filters (R, G, B) by a photo process, openings (C1, C2) exposing the drain electrodes (66) and the maintenance capacitor conductor patterns (64) are also formed. This enables the satisfactory formation of a profile when forming the drain electrodes (66) and the maintenance capacitor conductor patterns (64) on a protection film (70).

Figure 40A:
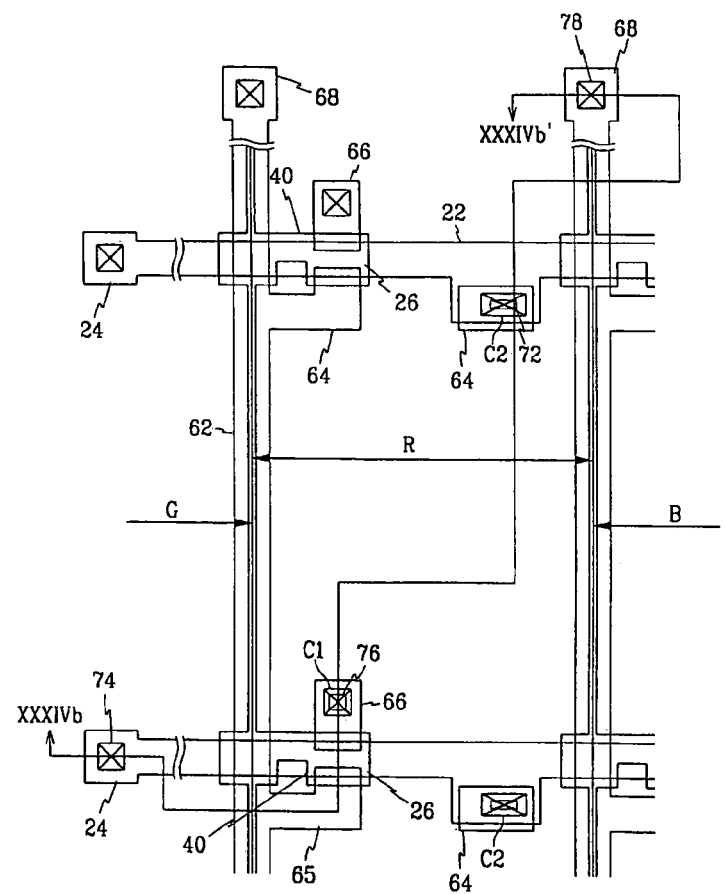
FIG. 40a is an arrangement view of the thin film transistor substrate of Example 13 of the present invention in a fifth manufacturing step.
Figure 40B:
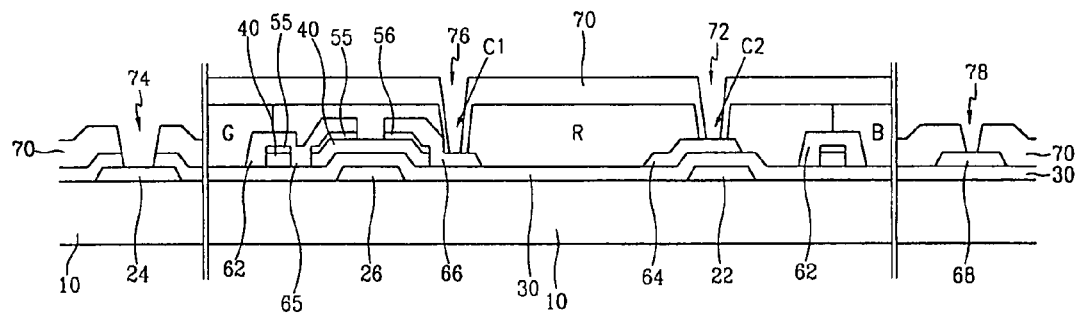

Next, as shown in FIGS. 40a and 40b, the protection film (70) is formed of the a—SiCOH film (low dielectric insulating film) of the substrate (10), and patterned together with the gate insulating film (30) by a photo etching process using a mask to form contact openings (72, 75, 76, 78). The contact openings (76, 74) exposing the drain electrodes (66) and the maintenance capacitor conductor patterns (64) are formed inside the openings (C1, C2) formed on the color filters (R, G, B). Thus, according to the present invention, a profile of the contact openings (76, 74) can be satisfactorily formed by forming in advance the openings (C1, C2) in the color filters (R, G, B) and then patterning the protection film

(70) to form the contact openings (76, 74) exposing the drain electrodes (66) and the maintenance capacitor conductor patterns (64).

Finally, as shown in FIGS. 7 to 9, ITO or IZO layers are vapor deposited at a thickness of 400 to 500 Å and etched by a photo etching process using a mask to form pixel electrodes (82), supplementary gate pads (84), and supplementary data pads (88).

This method can be applied to a manufacturing process using 5 sheets of masks as described above. The method can also be applied in the same manner to a manufacturing process of a thin film transistor substrate for liquid a display using 4 sheets of masks. This will be explained in detail with reference to the drawings, with a description of the manufacturing processes being omitted because they are explained in Examples 11 and 13.

First, the structure of a thin film transistor array substrate for a liquid crystal display according to the Examples of the present invention will be explained in detail with reference to FIGS. 41 to 43.

Figure 41:
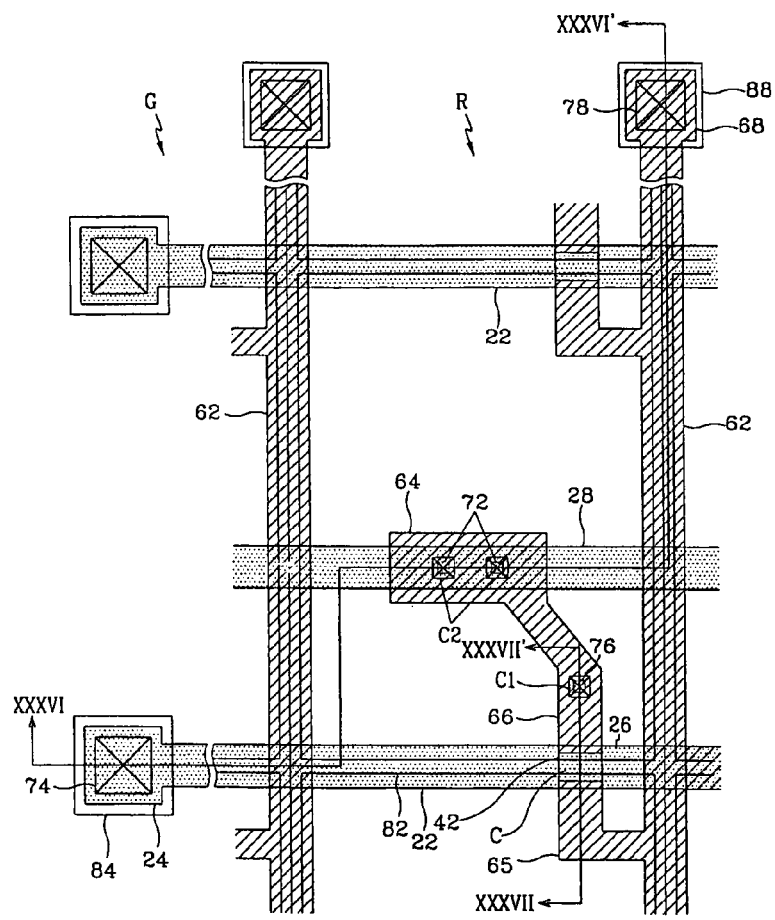
FIG. 41 is an arrangement view of a thin film transistor substrate for a liquid crystal display according to Example 14 of the present invention.
Figure 42:
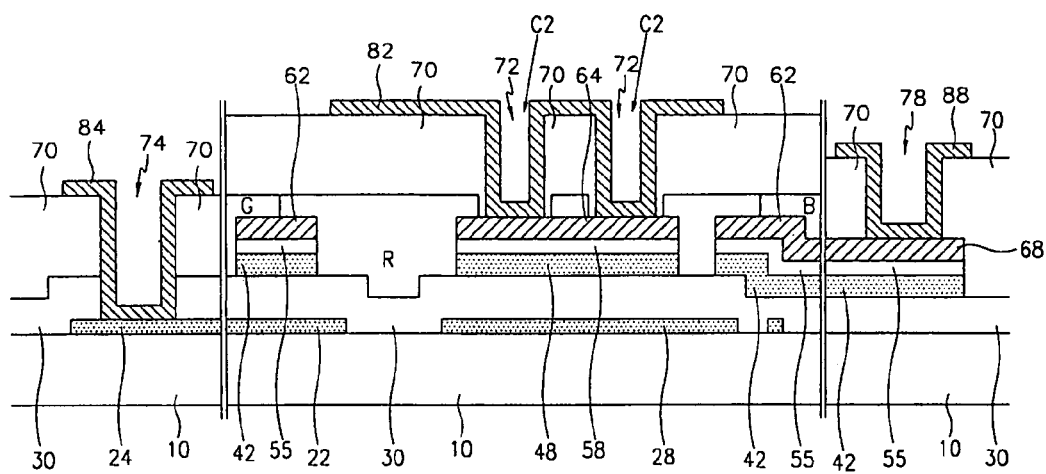
FIG. 42 and FIG. 43 are cross sectional views of the thin film transistor substrate of FIG. 41 respectively taken along line XXXVI-XXXVI' and line XXXVII-XXXVII'.
Figure 43:
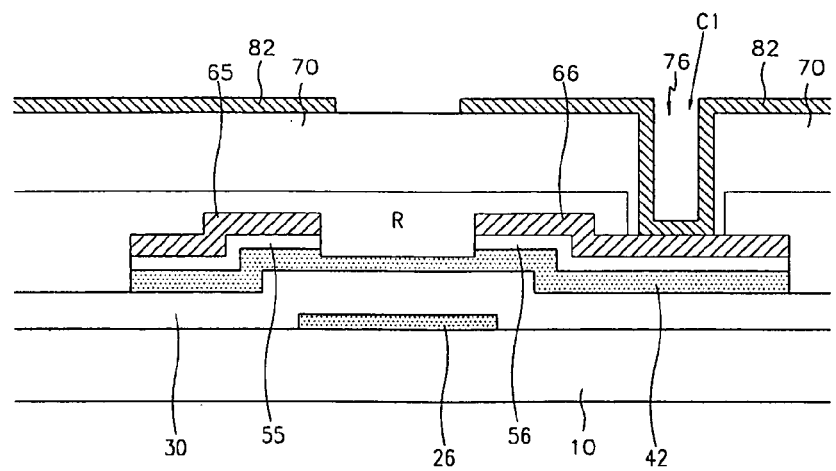

FIG. 41 is an arrangement view of the thin film transistor substrate for a liquid crystal display according to Example 14 of the present invention, and FIGS. 42 and 43 are cross sectional views of the thin film transistor substrate shown in FIG. 41 respectively taken along line XXXVI-XXXVI' and line XXXVII-XXXVII'. As shown in FIGS. 41 and 42, most of the structure is the same as that of Example 11.

However, as with Example 13, on the thin film transistor array, red, green, blue color filters (R, G, B) having openings (C1, C2) exposing maintenance capacitor conductor patterns (68) and drain electrodes (66) are formed, and on the color filters, a protection film (70) made of an a—SiCOH film (low dielectric insulating film) is formed by a chemical gas phase vapor deposition method.

The present invention can be applied in various ways in addition to those described with reference to the Examples. For example, the present invention can be usefully applied for a display requiring low temperature process conditions, such as a plastic liquid crystal display developed in order to improve impact resistance and reduce weight. Further, the present invention can be identically applied for a thin film transistor substrate for a reflection type liquid crystal display that displays picture images using external lights.

In addition, the gate insulating film should maintain a precise film quality in consideration of interface properties with the semiconductor layers (40) made of amorphous silicon. However, as the film quality becomes more precise, the vapor deposition speed becomes slower, thereby increasing the process time. Also, it is known that if the film quality is maintained at a precision thickness of about 500 Å from the surface contacting the semiconductor layers (40), a thin film transistor can operate without difficulty. Therefore, in the Examples of the present invention, the lower part of the insulating film is formed of the low dielectric insulating film having a fast vapor deposition speed, and the upper part of the gate insulating film is formed of silicon nitride having precise film quality, thereby reducing the process time without deteriorating thin film transistor performance.

As explained above, according to the present invention, the vapor deposition speed can be greatly improved while maintaining the physical properties of insulating film by forming a protection film with an a—SiCOH film (low dielectric insulating film) vapor deposited using silane gas. Accordingly, parasitic capacitance problems can be solved to realize a high aperture ratio structure and the process time can be reduced.

What is claimed is:

1. A process for manufacturing a thin film transistor substrate comprising the steps of:
   forming gate wiring comprising a gate line, a gate electrode connected with the gate line, and a gate pad connected with the gate line on an insulating substrate;
   forming a gate insulating film;
   forming a semiconductor layer;
   stacking and patterning conductive material to form data wiring comprising a data line intersecting the gate line, a data pad connected with the data line, a source electrode connected with the data line and adjacent to the gate electrode, and a drain electrode located on the opposite side of the source electrode around the gate electrode;
   stacking a low dielectric insulating film to form a protection film;
   patterning the protection film together with the gate insulating film to form contact openings for respectively exposing the gate pad, the data pad, and the drain electrode; and
   stacking and patterning a transparent conductive film to form a supplementary gate pad, a supplementary data pad, and a pixel electrode respectively connected with the gate pad, the data pad, and the drain electrode through the contact openings,
   wherein the protection film is formed by adding a reactant gas mixture comprising a main source gas, silane (SiH$_4$), and an oxidant on the data wiring to vapor deposit an a—SiCOH thin film by a CVD or PECVD method,
   wherein the ratio of the silane (SiH$_4$) gas to the main source gas is 1:0.5 to 1.

2. The process for manufacturing a thin film transistor substrate according to claim 1, wherein the main source gas is selected as one or more from the group consisting of organosilicon compounds represented by the following Chemical Formulae:

$$SiH_x(CH_3)_{4-x}$$

wherein, x is an integer, that is, 0, 1, 2 or 4, $$Si(OR^1)_x R^2_{4-x}$$

wherein, $R^1$ and $R^2$ are independently or simultaneously straight or branched C1-10 alkyl or alkenyl group substituted or unsubstituted by C1-5 alkyl or alkenyl group, and $R^1$ and $R^2$ are independently or simultaneously methyl, ethyl, propyl or vinyl group, and x is an integer from 0 to 4, and $$cyclic\text{-}(SiR^1R^2\text{—}O)_n$$

wherein, $R^1$ and $R^2$ are independently or simultaneously hydrogen, straight or branched C1-10 alkyl or alkenyl group substituted or unsubstituted by C1-5 alkyl or alkenyl group, and $R^1$ and $R^2$ are independently or simultaneously hydrogen, methyl, ethyl, propyl or vinyl group.

3. The process for manufacturing a thin film transistor substrate according to claim 1, wherein the oxidant is selected from the group consisting of O$_2$, N$_2$O, NO, CO$_2$, CO, ozone, and a mixture thereof.

4. The process for manufacturing a thin film transistor substrate according to claim 1, wherein the data wiring and the semiconductor layer are formed together by a photo etching process using a photosensitive film pattern having a first part, a second part thicker than the first part, and a third part thinner than the first part.

5. The process for manufacturing a thin film transistor substrate according to claim 4, wherein in the photo etching process, the first part is formed so as to be located between the source electrode and the drain electrode, and the second part is formed so as to be located on the data wiring.

6. The process for manufacturing a thin film transistor substrate according to claim 1, wherein the step of forming a gate insulating film is comprised of a first step of vapor depositing a low dielectric insulating film and a second step of vapor depositing a silicon nitride film, the first and second steps being conducted while maintaining vacuum.

7. A process for manufacturing a thin film transistor substrate comprising the steps of:
   forming gate wiring comprising a gate line, a gate electrode connected with the gate line, and a gate pad connected with the gate line on an insulating substrate;
   forming a gate insulating film;
   forming a semiconductor layer;
   stacking and patterning conductive material to form data wiring comprising a data line intersecting the gate line, a data pad connected with the data line, a source electrode connected with the data line and adjacent to the gate electrode, and a drain electrode located on the opposite side of the source electrode around the gate electrode;
   stacking a low dielectric insulating film to form a protection film;
   patterning the protection film together with the gate insulating film to form contact openings for respectively exposing the gate pad, the data pad, and the drain electrode; and
   stacking and patterning a transparent conductive film to form a supplementary gate pad, a supplementary data pad, and a pixel electrode respectively connected with the gate pad, the data pad, and the drain electrode through the contact openings,
   wherein the step of forming a protection film is conducted by adding a reactant gas mixture comprising a main source gas, silane (SiH$_4$), and an oxidant on the data wiring to vapor deposit an a—SiCOH thin film by a CVD or PECVD method,
   wherein the main source gas is selected as one or more from the group consisting of organosilicon compounds represented by the following Chemical Formulae:

$SiH_x(CH_3)_{4-x}$ wherein, x is an integer, that is, 0, 1, 2 or 4, $Si(OR^1)_x R^2_{4-x}$ wherein, $R^1$ and $R^2$ are independently or simultaneously straight or branched C1-10 alkyl or alkenyl group substituted or unsubstituted by C1-5 alkyl or alkenyl group, and $R^1$ and $R^2$ are independently or simultaneously methyl, ethyl, propyl or vinyl group, and x is an integer from 0 to 4, and cyclic-$(SiR^1R^2$—$O)_n$ wherein, $R^1$ and $R^2$ are independently or simultaneously hydrogen, straight or branched C1-10 alkyl or alkenyl group substituted or unsubstituted by C1-5 alkyl or alkenyl group, and $R^1$ and $R^2$ are independently or simultaneously hydrogen, methyl, ethyl, propyl or vinyl group.

8. The process for manufacturing a thin film transistor substrate according to claim 7, wherein the ratio of the silane (SiH$_4$) gas to the main source gas is 1:0.5 to 1.

9. The process for manufacturing a thin film transistor substrate according to claim 7, wherein the oxidant is selected from the group consisting of O$_2$, N$_2$O, NO, CO$_2$, CO, ozone, and a mixture thereof.

10. The process for manufacturing a thin film transistor substrate according to claim 7, wherein the low dielectric insulating film has a dielectric constant of 2 to 3.

11. The process for manufacturing a thin film transistor substrate according to claim 7, wherein the data wiring and the semiconductor layer are formed together by a photo etching process using a photosensitive film pattern having a first part, a second part thicker than the first part, and a third part thinner than the first part.

12. The process for manufacturing a thin film transistor substrate according to claim 11, wherein in the photo etching process, the first part is formed so as to be located between the source electrode and the drain electrode, and the second part is formed so as to be located on the data wiring.

13. The process for manufacturing a thin film transistor substrate according to claim 7, wherein the step of forming a gate insulating film is comprised of a first step of vapor depositing a low dielectric insulating film and a second step of vapor depositing a silicon nitride film, the first and second steps being conducted while maintaining vacuum.

14. The process for manufacturing a thin film transistor substrate according to claim 1, wherein the low dielectric insulating film has a dielectric constant of 2 to 3.

* * * * *